(12) United States Patent
Cho et al.

(10) Patent No.: US 11,195,954 B2
(45) Date of Patent: Dec. 7, 2021

(54) SEMICONDUCTOR DEVICES AND METHODS OF MANUFACTURING THE SAME

(71) Applicant: Samsung Electronics Co., Ltd., Suwon-si (KR)

(72) Inventors: Youngdae Cho, Hwaseong-si (KR); Sunguk Jang, Hwaseong-si (KR); Sujin Jung, Hwaseong-si (KR); Jungtaek Kim, Seoul (KR); Sihyung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 10 days.

(21) Appl. No.: 16/732,864

(22) Filed: Jan. 2, 2020

(65) Prior Publication Data
US 2020/0381546 A1 Dec. 3, 2020

(30) Foreign Application Priority Data
May 27, 2019 (KR) .................. 10-2019-0061794

(51) Int. Cl.
*H01L 29/78* (2006.01)
*H01L 29/423* (2006.01)

(52) U.S. Cl.
CPC ...... *H01L 29/785* (2013.01); *H01L 29/42356* (2013.01); *H01L 29/42392* (2013.01); *H01L 2029/7858* (2013.01)

(58) Field of Classification Search
None
See application file for complete search history.

(56) References Cited

U.S. PATENT DOCUMENTS

| 7,002,207 | B2 | 2/2006 | Kim et al. |
| 7,018,892 | B2 | 3/2006 | Shim et al. |
| 7,026,688 | B2 | 4/2006 | Kim et al. |
| 7,176,041 | B2 | 2/2007 | Lee et al. |

(Continued)

FOREIGN PATENT DOCUMENTS

KR   100481209 B1   4/2005

*Primary Examiner* — Hsien Ming Lee
(74) *Attorney, Agent, or Firm* — Muir Patent Law, PLLC

(57) ABSTRACT

A semiconductor device may include semiconductor patterns, a gate structure, a first spacer, a first semiconductor layer and a second semiconductor layer. The semiconductor patterns may be formed on a substrate, and may be spaced apart from each other in a vertical direction perpendicular to an upper surface of the substrate and may overlap in the vertical direction. The gate structure may be formed on the substrate and the semiconductor patterns. At least portion of the gate structure may be formed vertically between the semiconductor patterns. The first spacer may cover opposite sidewalls of the gate structure, the sidewalls opposite to each other in a first direction. The first semiconductor layer may cover the sidewalls of the semiconductor patterns in the first direction, and surfaces of the first spacer and the substrate. The first semiconductor layer may have a first concentration of impurities. The second semiconductor layer may be formed on the first semiconductor layer, and may have a second concentration of impurities different from the first concentration of impurities. The semiconductor device may have good characteristics and high reliability.

18 Claims, 40 Drawing Sheets

(56) References Cited

U.S. PATENT DOCUMENTS

| | | | |
|---|---|---|---|
| 7,381,601 B2 | 6/2008 | Kim et al. | |
| 7,544,985 B2 | 6/2009 | Shim et al. | |
| 7,615,429 B2 | 11/2009 | Kim et al. | |
| 7,709,277 B2 | 5/2010 | Lee et al. | |
| 8,815,691 B2 | 8/2014 | Colinge et al. | |
| 9,276,064 B1 | 3/2016 | Zang et al. | |
| 9,484,447 B2 | 11/2016 | Kim et al. | |
| 9,653,289 B1 | 5/2017 | Balakrishnan et al. | |
| 9,653,547 B1 | 5/2017 | Chang et al. | |
| 9,748,352 B2 | 8/2017 | Liu et al. | |
| 10,008,583 B1 | 6/2018 | Rodder et al. | |
| 10,090,193 B1* | 10/2018 | Chanemougame | H01L 29/0673 |
| 10,177,227 B1 | 1/2019 | Yoshida et al. | |
| 10,185,798 B2 | 1/2019 | Kim et al. | |
| 10,714,579 B2* | 7/2020 | Lee | H01L 29/775 |
| 2019/0214459 A1* | 7/2019 | Cheng | B82Y 10/00 |
| 2020/0044087 A1* | 2/2020 | Guha | H01L 29/42356 |

\* cited by examiner

SEMICONDUCTOR DEVICES AND METHODS OF MANUFACTURING THE SAME

CROSS-REFERENCE TO RELATED APPLICATION

This application claims priority under 35 USC § 119 to Korean Patent Application No. 10-2019-0061794, filed on May 27, 2019 in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to semiconductor devices having vertically stacked channels and methods of manufacturing the same.

2. Description of the Related Art

A multi-bridge-channel MOSFET (MBCFET) having high integration and high performance has been developed. In processes for forming a multi-bridge channel in the MBCFET, a semiconductor material of source/drain regions formed on both sides of the multi-bridge channel may be partially removed, and thus defects of the source/drain regions may occur.

SUMMARY

Example embodiments provide a semiconductor device having good characteristics.

Example embodiments provide methods of manufacturing a semiconductor device having good characteristics.

According to example embodiments, a semiconductor device may include semiconductor patterns, a gate structure, a first spacer, a first semiconductor layer and a second semiconductor layer. The semiconductor patterns may be formed on a substrate, and may be spaced apart from each other in a vertical direction perpendicular to an upper surface of the substrate and may overlap in the vertical direction. The gate structure may be formed on the substrate and the semiconductor patterns. At least portion of the gate structure may be formed vertically between the semiconductor patterns. The first spacer may cover opposite sidewalls of the gate structure, the sidewalls opposite to each other in a first direction. The first semiconductor layer may cover the sidewalls of the semiconductor patterns in the first direction, and surfaces of the first spacer and the substrate. The first semiconductor layer may have a first concentration of impurities. The second semiconductor layer may be formed on the first semiconductor layer, and may have a second concentration of impurities different from the first concentration of impurities.

According to example embodiments, a semiconductor device may include a stacked structure, a first semiconductor layer, and a second semiconductor layer. The stacked structure may be formed on a substrate. The stacked structure may include a semiconductor pattern, a gate structure and a first spacer. The semiconductor pattern and the spacer may be exposed at an outer wall of the stacked structure in a first direction parallel to an upper surface of the substrate. The first semiconductor layer may cover the outer wall of the stacked structure in the first direction and may cover the surface of the substrate. The first semiconductor layer may be doped with impurities to have a first concentration. The second semiconductor layer may be formed on the first semiconductor layer. The second semiconductor layer may be doped with impurities to have a second concentration higher than the first concentration.

According to example embodiments, a semiconductor device may include a semiconductor patterns, a first spacer, a gate structure, a first semiconductor layer and a second semiconductor layer. The semiconductor patterns may be formed on a substrate. The semiconductor patterns may be spaced apart from each other in a vertical direction perpendicular to an upper surface of the substrate. The first spacer may be formed between the semiconductor patterns in the vertical direction. The first spacer may contact upper and lower surfaces of the semiconductor patterns at edges of the semiconductor patterns. The gate structure may be formed on the substrate to fill a first gap defined by the semiconductor patterns and first spacers. The first semiconductor layer may cover the sidewalls of the semiconductor patterns in the first direction, and surfaces of the first spacer and the substrate. The second semiconductor layer may be formed on the first semiconductor layer. The second semiconductor layer may have a concentration of impurities different from a concentration of impurities of the first semiconductor layer.

According to example embodiments, a method of manufacturing a semiconductor device includes, alternately and repeatedly stacking sacrificial patterns and semiconductor patterns on a substrate to form a structure. A first spacer may be formed on sidewalls of the sacrificial patterns. A first semiconductor layer may be formed to cover sidewalls of the structure including the sacrificial patterns and semiconductor patterns and covering the substrate. A second semiconductor layer may be formed on the first semiconductor layer, and the second semiconductor layer may have a concentration of impurities different from a concentration of impurities of the first semiconductor layer. The sacrificial patterns may be removed to form first gaps. A gate structure may be formed to surround surfaces of the semiconductor patterns, and the gate structure may fill at least the first gaps.

The semiconductor device in accordance with example embodiments may include the first semiconductor layer covering the sidewall of the first spacer, the sidewalls of the semiconductor pattern and the surface of the substrate. The semiconductor pattern and the substrate may serve as the channel. The second semiconductor layer may be formed on the first semiconductor layer. The first semiconductor layer may serve as a blocking layer for preventing etching sources from penetrating into the second semiconductor layer. Thus, the second semiconductor layer serving as source/drain regions of the semiconductor device may not be etched, or may not have holes formed therein.

DESCRIPTION OF EMBODIMENTS

Hereinafter, two directions substantially parallel to an upper surface of a substrate and crossing each other may be referred to as first and second directions, respectively, and a direction substantially perpendicular to the upper surface of the substrate may be referred to as a vertical direction. In example embodiments, the first and second directions may be substantially perpendicular to each other.

Figure 1A:
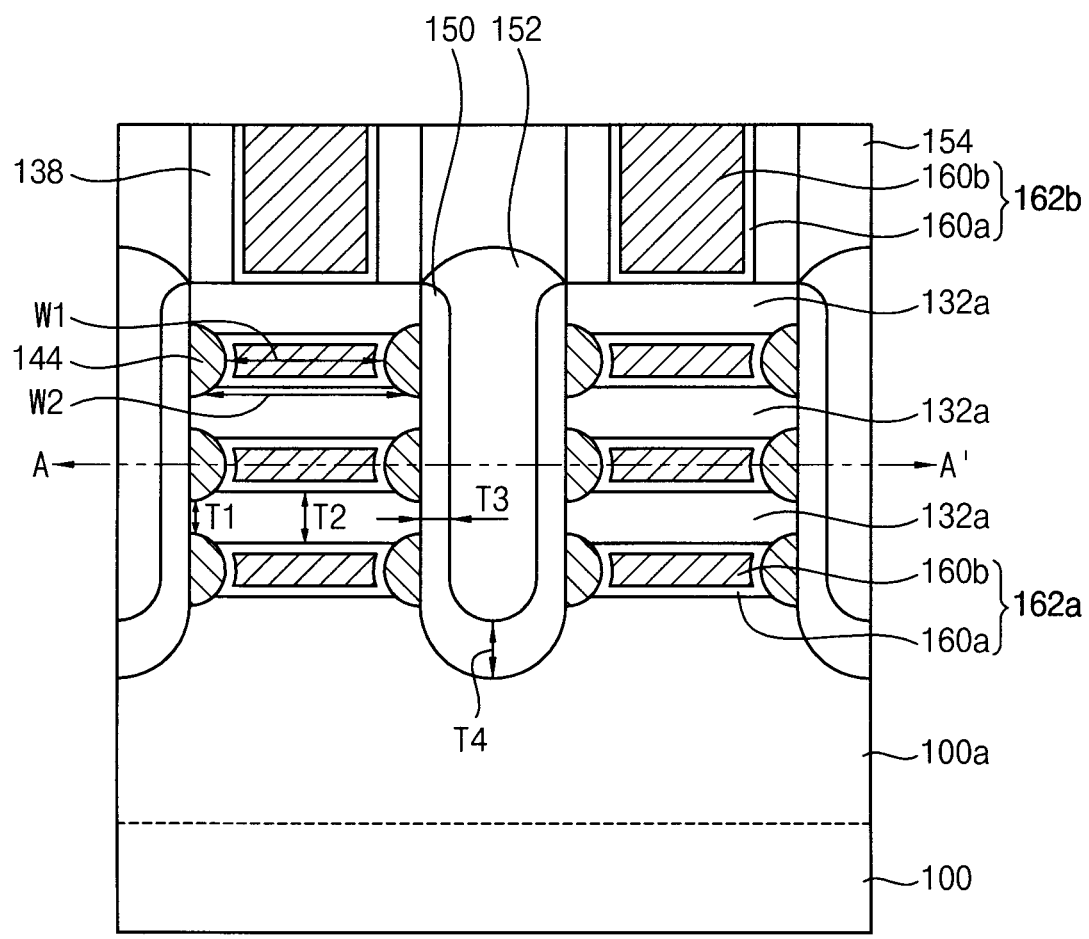
FIGS. 1A, 1B and 2 are cross-sectional views illustrating a semiconductor device in accordance with example embodiments.
Figure 1B:
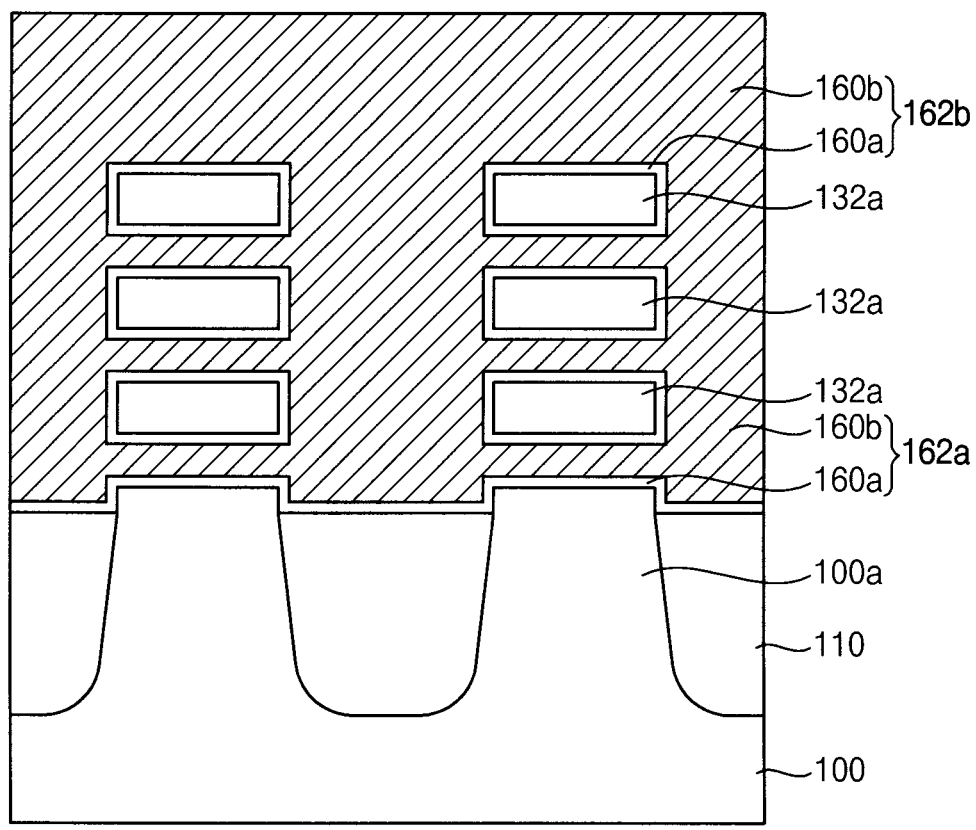
Figure 2:
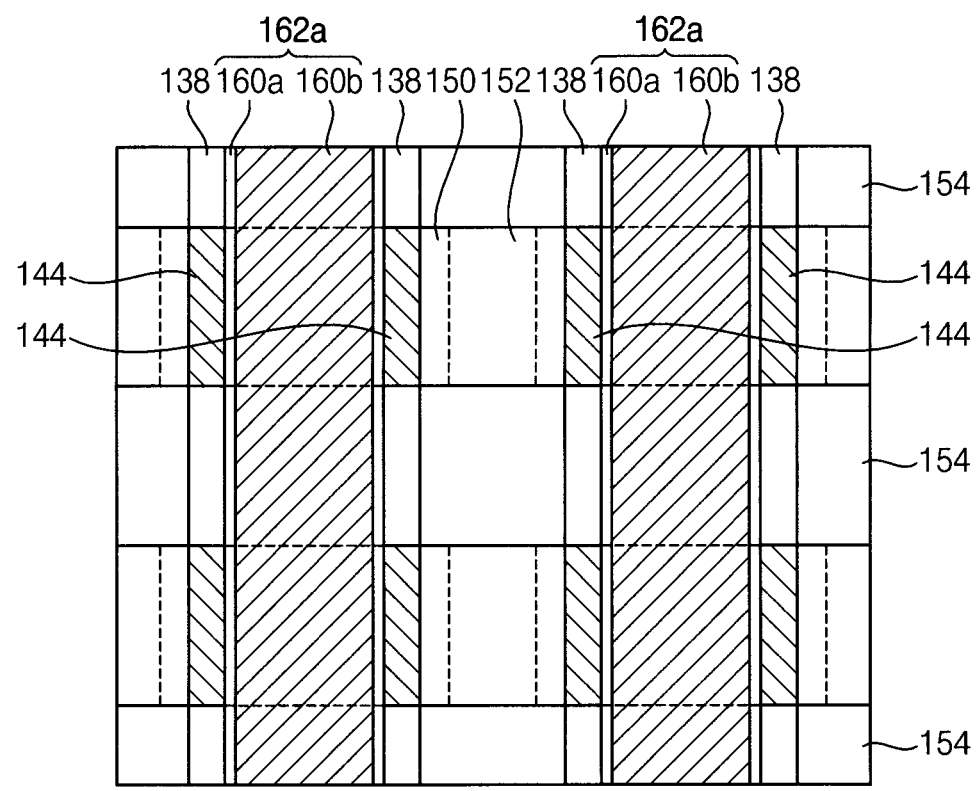
Figure 3:
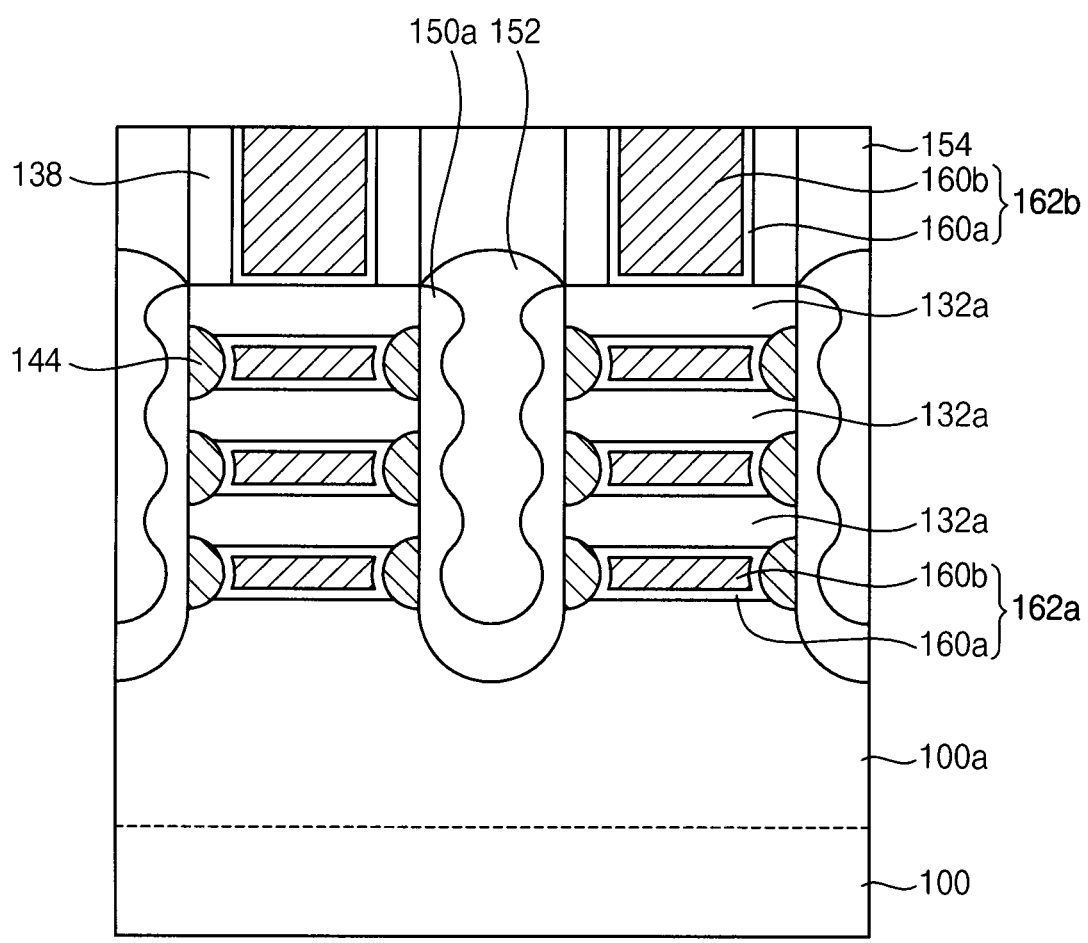
FIGS. 3, 4A and 4B are cross-sectional views illustrating a semiconductor device in accordance with some example embodiments.
Figure 4A:
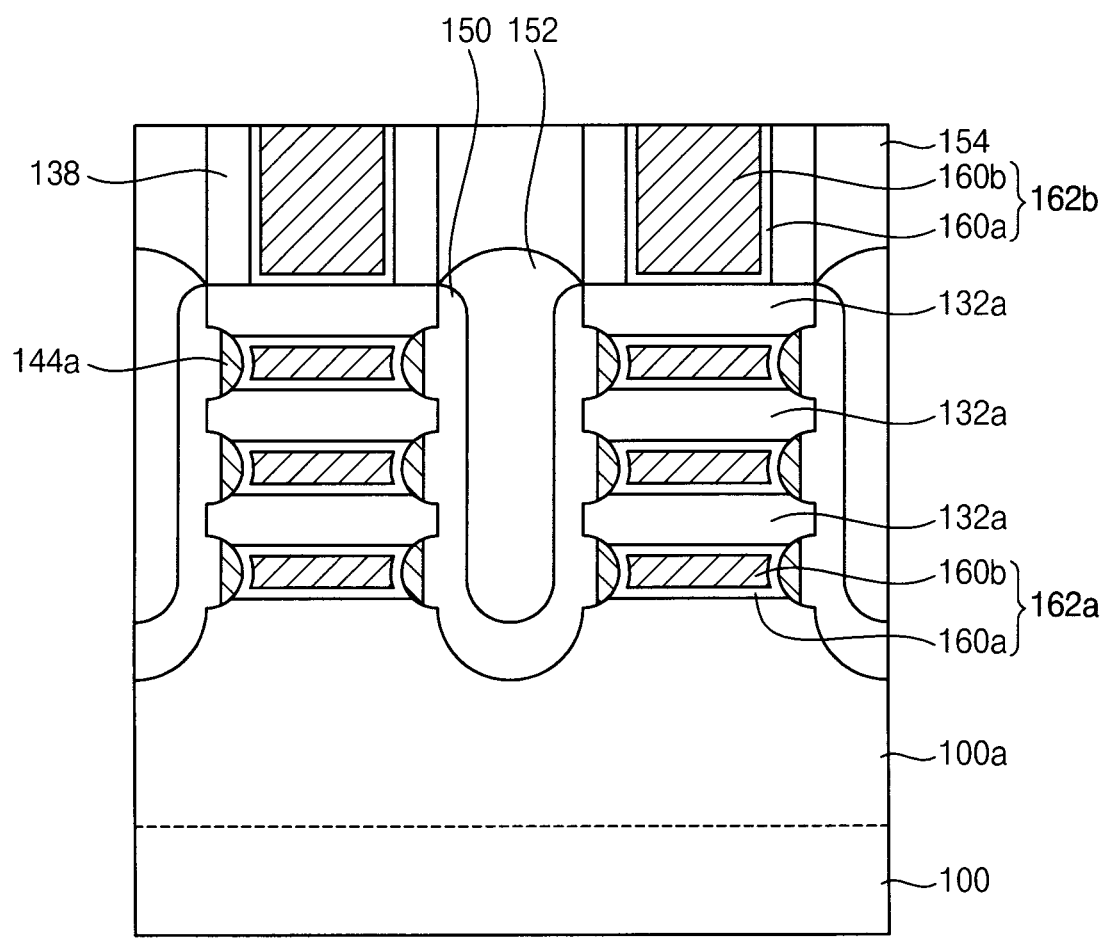
Figure 4B:
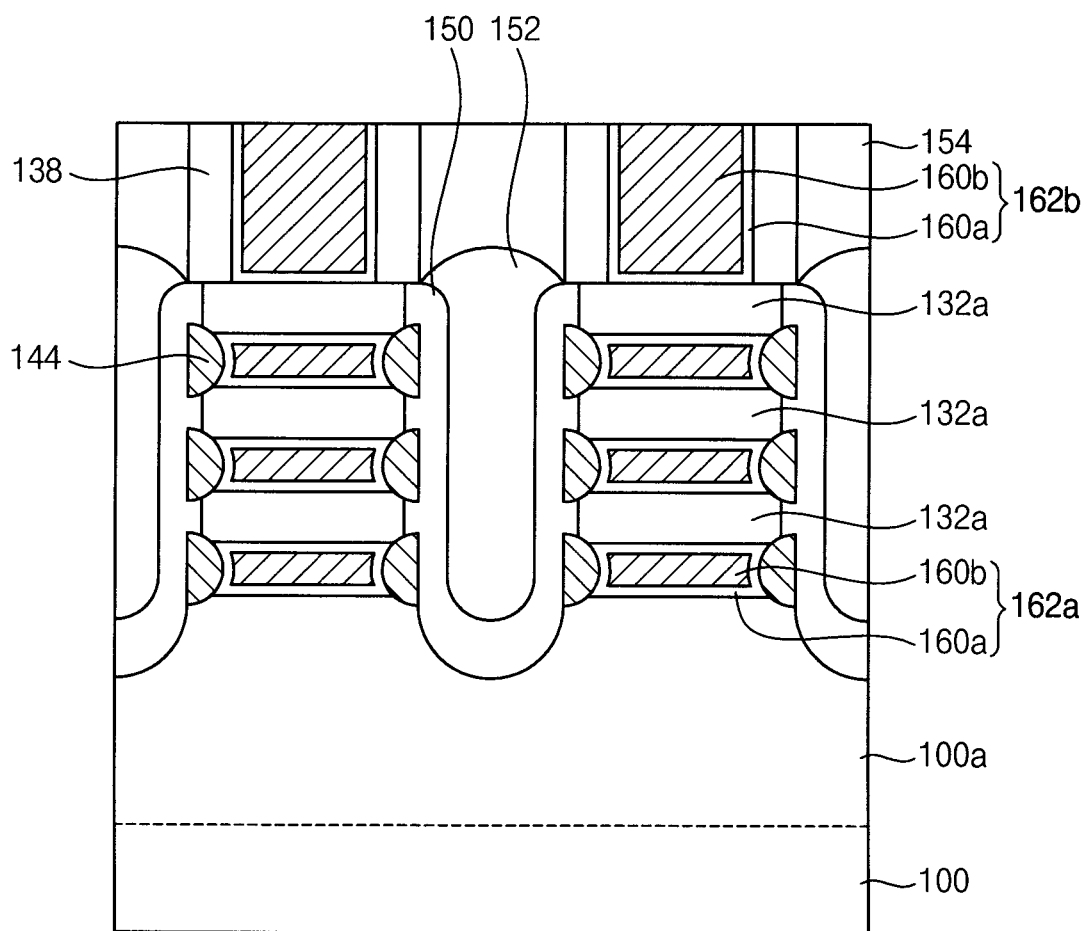

FIGS. 1A, 1B and 2 are cross-sectional views illustrating a semiconductor device in accordance with example embodiments. FIGS. 3, 4A and 4B are cross-sectional views illustrating a semiconductor device in accordance with some example embodiments.

FIG. 1A is a cross-sectional view of a portion of a gate pattern cut in the first direction. FIG. 1B is a cross-sectional view of a portion of a gate pattern cut in the second direction. FIG. 2 is a cross-sectional view taken along the line A-A' of FIG. 1 (e.g., a top down view). That is, FIG. 2 is the cross-sectional view of a portion of a gate pattern interposed between semiconductor patterns in a horizontal direction.

Referring to FIGS. 1A, 1B and 2, the semiconductor device may be formed on a substrate 100, and the semiconductor device may include semiconductor patterns 132a, gate structures 162a and 162b, a first semiconductor layer 150, a second semiconductor layer 152 and a first spacer 144. The semiconductor device may further include an active region 100a, an isolation pattern 110, a second spacer 138, and an insulation layer 154.

A substrate 100 includes or has a material composition of one or more semiconductor materials, such as silicon, germanium, silicon-germanium, or III-V compounds such as GaAs, AlGaAs, InAs, InGaAs, etc. In example embodiments, the silicon substrate may be a (100) substrate, (110) substrate or (111) substrate. Items with the same material composition described herein include the same element/compounds or set of elements/compounds, having the same or substantially the same ratios with respect to each other.

The active region 100a may protrude from an upper surface of the substrate 100 in the vertical direction, and may extend lengthwise in the first direction. An item, layer, or portion of an item or layer described as extending "lengthwise" in a particular direction has a length in the particular direction and a width perpendicular to that direction, where the length is greater than the width.

Also, a plurality of the active regions 100a may be arranged in the second direction. The active region 100a may be formed by partially removing an upper portion of the substrate 100, and thus the active region 100a may include a material substantially the same as a material of the substrate 100, and may have the same material composition as that of the substrate. In this case, the active region 100a may be considered to be part of the substrate 100. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

A lower sidewall of the active region 100a may be surrounded by the isolation pattern 110. The isolation pattern 110 may include and may be formed of, e.g., an oxide such as silicon oxide.

The semiconductor patterns 132a are spaced apart from each other in the vertical direction, and vertically overlap in the vertical direction. In example embodiments, a lowermost semiconductor pattern 132a is spaced apart from an upper surface of the active region 100a. The semiconductor patterns 132a stacked in the vertical direction may serve as multi-channel regions of one transistor. For example, a stack of semiconductor patterns 132a formed on an active region 100a may together form a channel region of a transistor (having multiple channels corresponding to the respective individual semiconductor patterns). The semiconductor patterns 132a stacked in the vertical direction may serve as a semiconductor pattern structure. The semiconductor pattern structure may include a gap between the semiconductor patterns 132a in the vertical direction. Each semiconductor pattern 132a may be described as an individual semiconductor pattern or a single-layer semiconductor pattern, in contrast with two or more semiconductor patterns that form a stack, which may be referred to as a stacked semiconductor pattern or multi-layer semiconductor pattern.

In example embodiments, the semiconductor pattern structure may be formed on the active region 100a extending in the first direction. A plurality of semiconductor pattern structures may be aligned in each of the first direction and the second direction.

In example embodiments, the semiconductor pattern 132a may include and may be silicon. In some example embodiments, the semiconductor pattern 132a may include and be a material such as germanium, silicon germanium, InP, GaAs, InGaAs, etc.

The gate structures 162a and 162b may be formed on the substrate 100, and may extend lengthwise in the second direction. The first spacer 144 or the second spacer 138 may be formed on sidewalls of the gate structures 162a and 162b.

The first spacer 144 may be formed on both (e.g., opposite) ends in the first direction of a gap between the semiconductor patterns 132a stacked in the vertical direction and a gap between the active region 100a and the semiconductor pattern 132a closest to the active region 100a. For example, the first spacer 144 may contact an upper surface and a lower surface of both ends in the first direction of the semiconductor patterns 132a stacked in the vertical direction, and the first spacer 144 may support the upper surface and the lower surface of the semiconductor patterns 132a. Thus, a first gap (refer to 158 of FIGS. 25 and 26) may be defined as space between the semiconductor patterns 132a and the first spacer 144 and space between the semiconductor pattern 132a, the active region 100a and the first spacer 144. Also, the gate structures 162a and 162b may fill the first gap 158. The "first spacer" 144 may refer to both spacers, one at either end, of the first gap 158, or may refer to just one of the spacers, depending on the context.

The gate structures 162a and 162b may fill the first gaps 158 included in the semiconductor patterns arranged in the second direction, and the gate structures 162a and 162b may cover a front side and a back side in the second direction of the semiconductor pattern structure. Also, the gate structures 162a and 162b may be formed on the uppermost surface of each of the semiconductor pattern structures. Thus, the gate structures 162a and 162b may have an upper surface higher than the uppermost surface of each of the semiconductor pattern structures.

Hereinafter, a portion of the gate structure formed in the first gap is referred to as a first gate structure 162a and other portion of the gate structure are referred to as a second gate structure 162b.

The second spacer 138 may be formed on sidewalls of the gate structure 162a and 162b formed on the uppermost surface of each semiconductor pattern structure and sidewalls of the gate structure 162b formed between the sidewalls of the semiconductor pattern structures that are opposite to each other in the second direction. For example, the second spacer 138 may be formed on the sidewalls of the second gate structure 162b that are opposite to each other in the first direction. The "second spacer" 138 may refer to both spacers, one at either end, of a gate structure 162b, or may refer to just one of the spacers, depending on the context The gate structures 162a and 162b may include a gate insulation pattern 160a and a gate pattern 160b. The gate insulation pattern 160a may surround the surface of the gate pattern 160b. In example embodiments, a work function control pattern may be further formed between the gate insulation pattern 160a and the gate pattern 160b.

The gate insulation pattern 160a may be formed on a surface of each semiconductor pattern 132a and an upper surface of the active region 100a. The gate insulation pattern 160a may contact the first and second spacers 144 and 138. The term "contact" as used herein refers to a direct connection, e.g., touching.

The gate pattern 160b may fill the first gap and a space between the semiconductor patterns in the second direction, and the gate pattern 160b may be further formed on the uppermost surface of the semiconductor pattern structure.

The gate insulation pattern 160a may include, or may be, e.g., a metal oxide having a high dielectric constant such as hafnium oxide, tantalum oxide, zirconium oxide, or the like. The work function control pattern, if used, may include, or may be, e.g., titanium nitride, titanium oxynitride, titanium oxynitride, titanium silicon nitride, titanium silicon oxynitride, titanium aluminum oxynitride, tantalum nitride, tantalum oxynitride, tantalum aluminum oxynitride, tungsten nitride, tungsten carbonitride, aluminum oxide, or the like.

The gate pattern 160b may include, or may be, e.g., a metal such as titanium, aluminum, tungsten, or a metal alloy, a metal nitride or metal carbide.

A first spacer 144 may contact the sidewalls of the first gate structure 162a. Thus, a sidewall profile of the first gate structure 162a may be the same as a shape of a contacting surface between the first spacer 144 and the first gate structure 162a.

In example embodiments, an outer wall of the first spacer 144 may be parallel to and coplanar with the sidewalls of the semiconductor pattern 132a in the vertical direction. Thus, the sidewalls of the first gate structure 162a may be covered by the first spacer 144, and the sidewalls of the semiconductor pattern 132a may be exposed by and with respect to the first spacer 144.

In some example embodiments, such as in the semiconductor device shown in FIG. 4A, the sidewalls of the semiconductor pattern 132a may protrude in the first direction from the outer wall of the first spacer 144a. For example, the outer wall of the first spacer 144a may be formed to be inwardly recessed from the sidewalls of the semiconductor pattern 132a in the first direction. Thus, the sidewalls of the first gate structure 162a may be covered by the first spacers 144a, and the upper and lower surfaces of both ends of the semiconductor pattern 132a and the sidewalls of the semiconductor pattern 132a are exposed by and with respect to the first spacers 144a.

In some example embodiments, such as in the semiconductor device shown in FIG. 4B, the outer wall of the first spacer 144 may protrude in the first direction from the semiconductor pattern 132a.

In example embodiments, the first spacers 144 contact the sidewalls of the first gate structure 162a and the upper and lower surfaces at edges of both sides of the semiconductor pattern 132a in the first direction (e.g., at edge portions of the semiconductor pattern 132a). A surface of the first spacer 144 which contacts the sidewalls of the first gate structure 162a and the upper and lower surfaces at edges of both sides of the semiconductor pattern 132a is referred to as an inner surface of the first spacer 144. The inner surface of the first spacer 144 may have a concave rounded shape toward a central portion of the first gate structure 162a in the first direction.

According to the shape of the first spacer 144, a thickness of the semiconductor pattern 132a in the vertical direction may vary depending on a position thereof. Particularly, a first thickness T1 of the semiconductor pattern 132a in the vertical direction at the portion in contact with the first spacer 144 may be less than a second thickness T2 of the semiconductor pattern 132a in the vertical direction at a central portion in the first direction. The central portion may be a non-contacting portion of the first spacer. In example embodiments, the thickness of the semiconductor pattern 132a in the vertical direction at a portion in contact with the first spacer 144 may be gradually reduced toward an end of the semiconductor pattern 132a.

In addition, according to the shape of the first spacer 144, a width of the first gate structure 162a between the semiconductor patterns 132a may vary depending on a position thereof. A central portion of the first gate structure 162a in the vertical direction may have a first width W1 in the first direction. The first width W1 may be smaller than a second width W2 in the first direction of the first gate structure 162a of upper and lower portions in the vertical direction. In example embodiments, the width of the first gate structure 162a in the first direction may be gradually reduced from the upper and lower surfaces thereof toward the central portion thereof.

As the first spacer 144 is formed, the width (e.g., a maximum width) of the first gate structure 162a in the first direction may be smaller than the width (e.g., maximum width) of the semiconductor pattern 132a in the first direction.

A stacked structure including the gate structures 162a and 162b, the semiconductor patterns 132a, and the first and second spacers 144 and 138 may extend in the second direction. The semiconductor patterns 132a, and the first and second spacers 144 and 138 may be exposed at sidewalls in the first direction of the stacked structure.

The first spacer 144 may include, or may be, a nitride, such as silicon nitride, silicon carbonitride, silicon boron nitride, silicon oxycarbonitride, or the like, and the second spacer 138 may include, or may be, a nitride, such as silicon nitride. The first spacer 144 may have a different material and/or material composition from the second spacer 138. Alternately, the first spacer 144 and the second spacer 138 may have substantially the same material.

The first semiconductor layer 150 may contact the sidewalls of the semiconductor patterns 132a and the first spacers 144 and the upper surface of the active region 100a. The first semiconductor layer 150 may have a connected shape, and be continuously formed (i.e., to have a continuously connected shape), along the sidewalls of the semiconductor patterns 132a and the first spacers 144 and the upper surface of the active region 100a. For example, the first semiconductor layer 150 may be formed along the upper surface of the active region 100a, and the sidewalls of the first spacers 144 and the semiconductor patterns 132a to be adjacent to each other in the first direction. Thus, the semiconductor patterns 132a may be connected to each other by the first semiconductor layer 150. Also, the surfaces of the semiconductor patterns 132a and the first spacers 144 may be completely covered by the first semiconductor layer 150.

In example embodiments, the first semiconductor layer 150 formed on the sidewalls of the semiconductor patterns 132a and the first spacers 144 have a third thickness T3 (e.g., measured in a direction perpendicular to the sidewall on which it is formed, such as in the first direction). The first semiconductor layer 150 formed on the upper surface of the active region 100a may have a fourth thickness T4 greater than the third thickness T3 (e.g., measured in a direction perpendicular to the surface on which it is formed, such as in the vertical direction where the label T4 is shown).

The first semiconductor layer 150 may be doped with impurities to have a first impurity concentration.

In example embodiments, the first semiconductor layer 150 includes silicon doped with n-type impurities. For example, the n-type impurities may include phosphorus (P) or arsenic (As). In this case, the first semiconductor layer 150 may serve as a source/drain extension region of an NMOS transistor.

In some example embodiments, the first semiconductor layer 150 includes silicon-germanium doped with p-type impurities. For example, the p-type impurities may include boron. In this case, the first semiconductor layer 150 may serve as a source/drain extension region of a PMOS transistor.

In some example embodiments, in the semiconductor device shown in FIG. 3, a thickness of the first semiconductor layer 150a in the first direction formed on the sidewalls of the semiconductor patterns 132a and the first spacers 144 is not uniform. For example, a thickness of the first semiconductor layer 150a formed on the semiconductor patterns 132a may be greater than a thickness of the first semiconductor layer 150a formed on the first spacers 144 (e.g., as measured perpendicular to the sidewall surface formed by the sidewalls of the semiconductor patterns 132a and the first spacers 144).

The second semiconductor layer 152 may be formed on the first semiconductor layer 150. The second semiconductor layer 152 may be doped with impurities to have a second impurity concentration higher than the first impurity concentration. In example embodiments, the second impurity concentration may be at least ten times the first impurity concentration.

In example embodiments, the second semiconductor layer 152 may be doped with impurities to have a conductivity type the same as a conductivity type of impurities of the first semiconductor layer 150. Also, the second semiconductor layer 152 may include a material (or set of materials) the same as a material (or set of materials) of the first semiconductor layer 150.

In example embodiments, the second semiconductor layer 152 may fill a space between the semiconductor pattern structures spaced apart from each other in the first direction.

In example embodiments, the second semiconductor layer 152 may include silicon doped with n-type impurities. In this case, the second semiconductor layer 152 may serve as a source/drain region of the NMOS transistor.

In some embodiments, the second semiconductor layer 152 may include silicon-germanium doped with p-type impurities. In this case, the second semiconductor layer 152 may serve as a source/drain region of a PMOS transistor.

As described above, the second semiconductor layer 152 may be doped with impurities to have an impurity concentration higher than the impurity concentration of the first semiconductor layer 150. When etching sources, e.g., etching gas or etchant may contact the first and second semiconductor layers 150 and 152, the second semiconductor layer 152 doped with impurities of a high concentration may be etched faster than the first semiconductor layer 150 doped with impurities of a low concentration. Thus, if the etching gas or the etchant penetrates into the second semiconductor layer 152, the second semiconductor layer 152 may partially be etched to form a hole therein.

However, as described above, the first semiconductor layer 150 may be formed between the sidewalls of the semiconductor patterns 132a and the first spacers 144 and the upper surface of the active region 100a and the second semiconductor layer 152. Thus, the second semiconductor layer 152 and the semiconductor patterns 132a may not contact each other, and the second semiconductor layer 152 and the first spacer 144 may not contact each other. For example, the second semiconductor layer 152 may be blocked by the first semiconductor layer 150 having a relatively low etching rate, so that the etching gas or the etchant does not penetrate into the second semiconductor layer 152. Therefore, the second semiconductor layer 152 may not be damaged.

The semiconductor patterns 132a, the gate structures 162a and 162b, and the first and second semiconductor layers 150 and 152 may serve as an MBCFET.

The insulation layer 154 may surround the sidewalls of the second spacer 138 and the first and second semiconductor layers 150 and 152. The insulation layer 154 may be formed to fill a space between the gate structures 162a and 162b. The insulation layer 154 may include an oxide such as silicon oxide.

The semiconductor device may further include contact plugs, wirings, etc., electrically connected to the second semiconductor layer 152 and/or the gate structures 162a and 162b.

As described above, the semiconductor device may include the first semiconductor layer 150 covering the sidewalls of the semiconductor patterns 132a and the first spacers 144, and the upper surface of the active region 100a. Thus, the second semiconductor layer 152 and the semiconductor patterns 132a may not contact, and the second semiconductor layer 152 and the first spacer 144 may not contact the first spacer 144. Thus, damage to the second semiconductor layer 152 due to the etching gas or the etchant may decrease.

FIGS. 5 to 27 are plan views, cross-sectional views, and perspective views illustrating a method of manufacturing a semiconductor device in accordance with example embodiments.

FIGS. 6, 8, 11, 13 and 23 are plan views, and FIGS. 16, 19, 22 and 26 are perspective views of a portion of the semiconductor device. Each plan view shows a top portion of the semiconductor device, and each perspective view shows a lower portion of a dummy gate structure.

Figure 10:
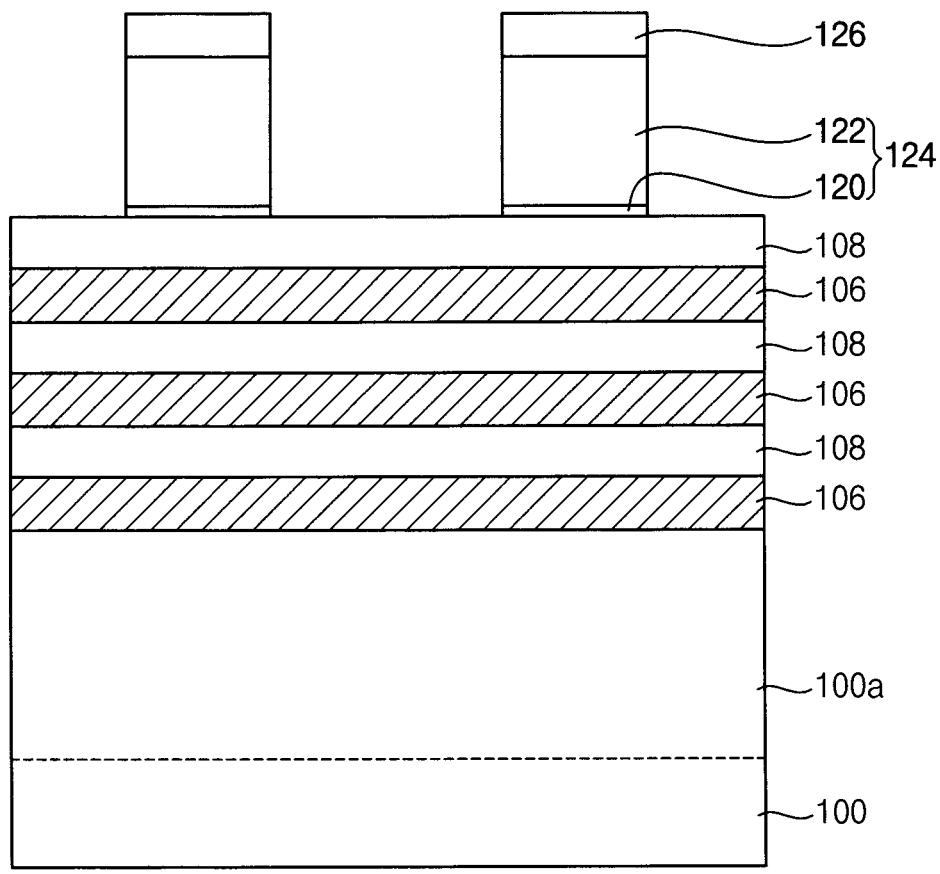
Figure 11:
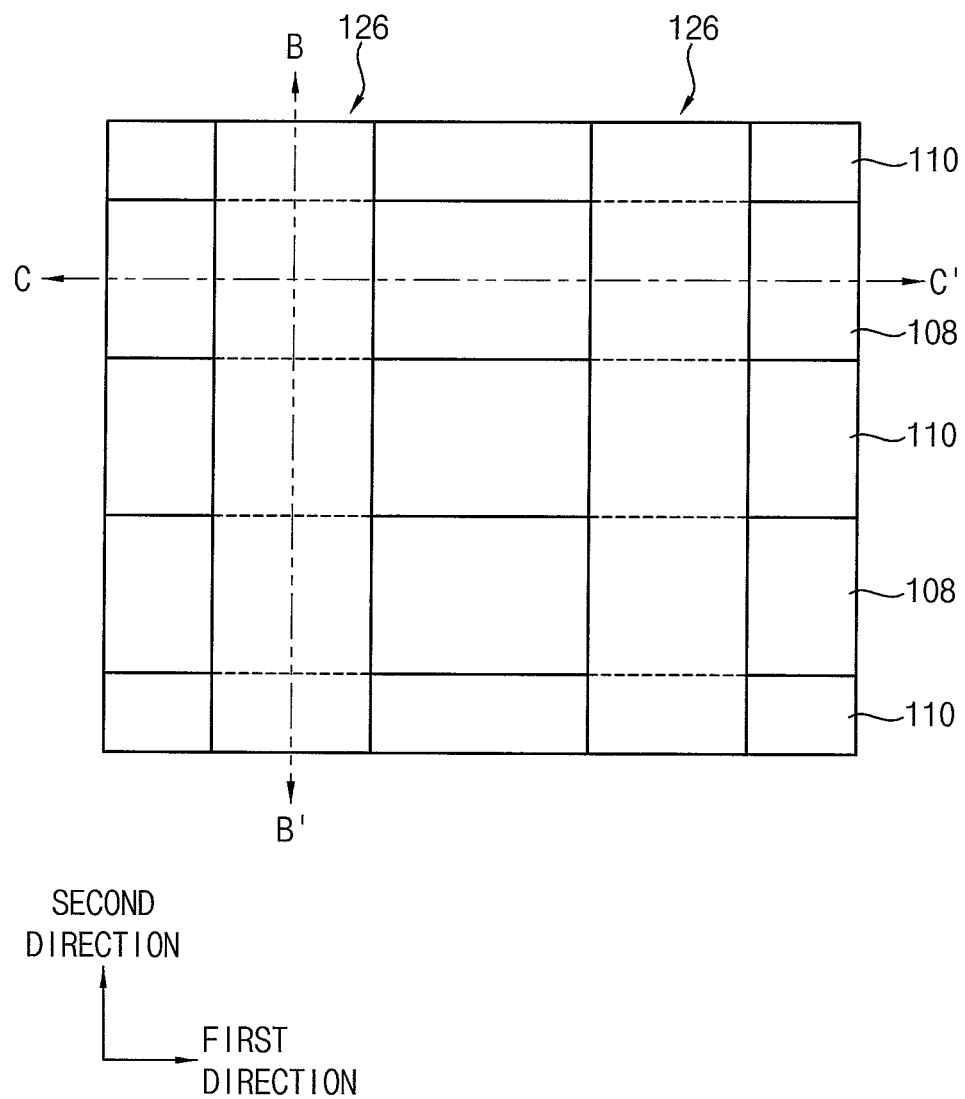

FIGS. 5, 7, 9 and 27 are cross-sectional views taken along the line B-B' of FIG. 11. For example, FIGS. 5, 7, 9 and 27 are cross-sectional views of a portion of the gate pattern cut in the second direction. FIGS. 10, 12, 14, 15, 17, 18, 20, 21, 24 and 25 are cross-sectional views taken along the line C-C' of FIG. 11. FIGS. 10, 12, 14, 15, 17, 18, 20, 21, 24 and 25 are cross-sectional views of a portion of the gate pattern cut in the first direction.

Figure 5:
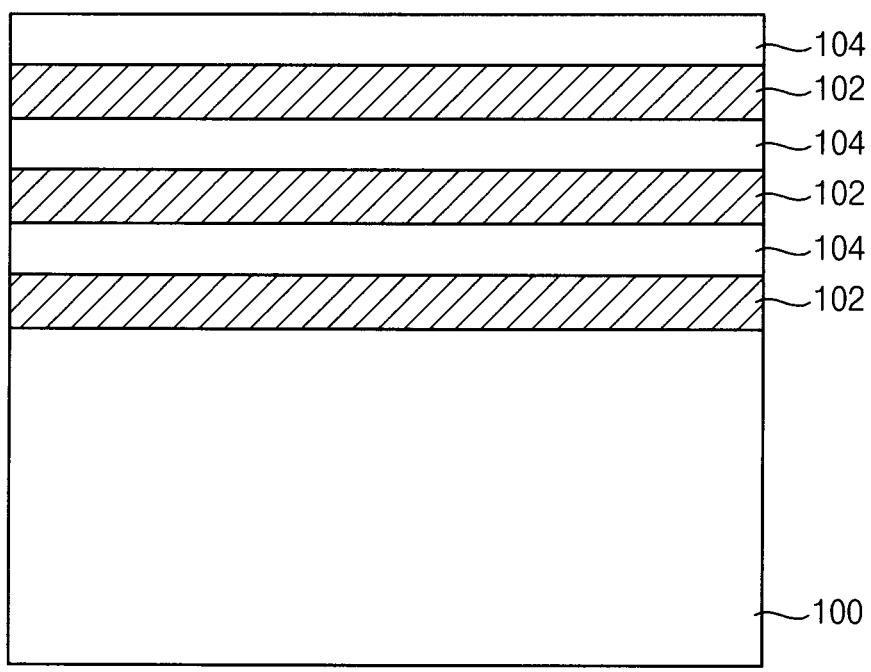
FIGS. 5 to 27 are plan views, cross-sectional views, and perspective views illustrating a method of manufacturing a semiconductor device accordance with example embodiments.
Figure 5:
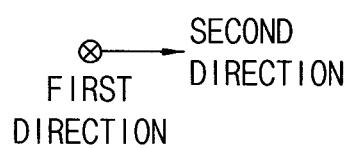
Figure 6:
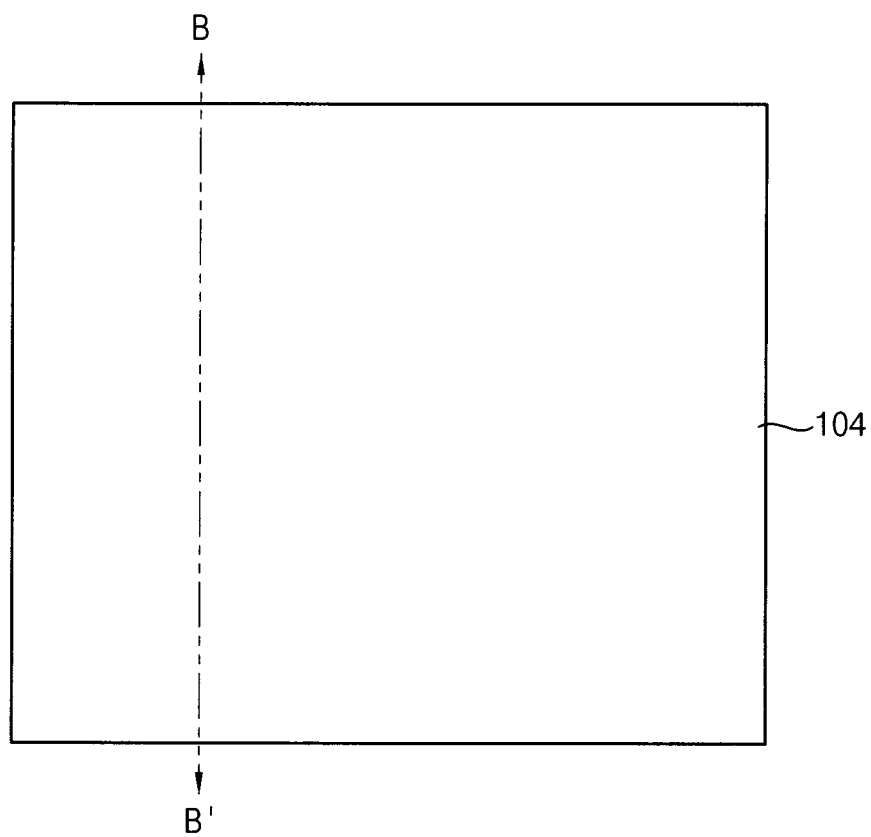
Figure 6:
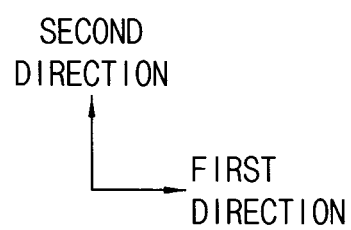

Referring to FIGS. 5 and 6, sacrificial layers 102 and semiconductor layers 104 are alternately and repeatedly stacked on a substrate 100. An uppermost layer may be the semiconductor layer 104.

The sacrificial layer 102 may include a material having a high etch selectivity with respect to the substrate 100 and the semiconductor layer 104. The sacrificial layer 102 may include a semiconductor material. For example, the semiconductor layer 104 may be a silicon layer, and the sacrificial layer 102 may be silicon-germanium.

In example embodiments, the sacrificial layer 102 and the semiconductor layer 104 are formed by an epitaxial growth process.

Figure 7:
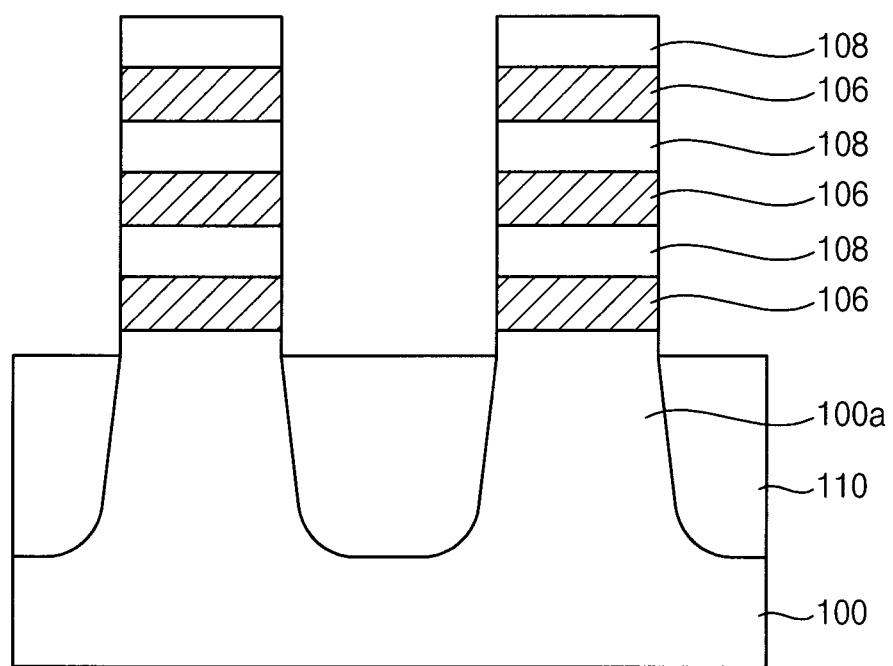
Figure 7:
Figure 8:
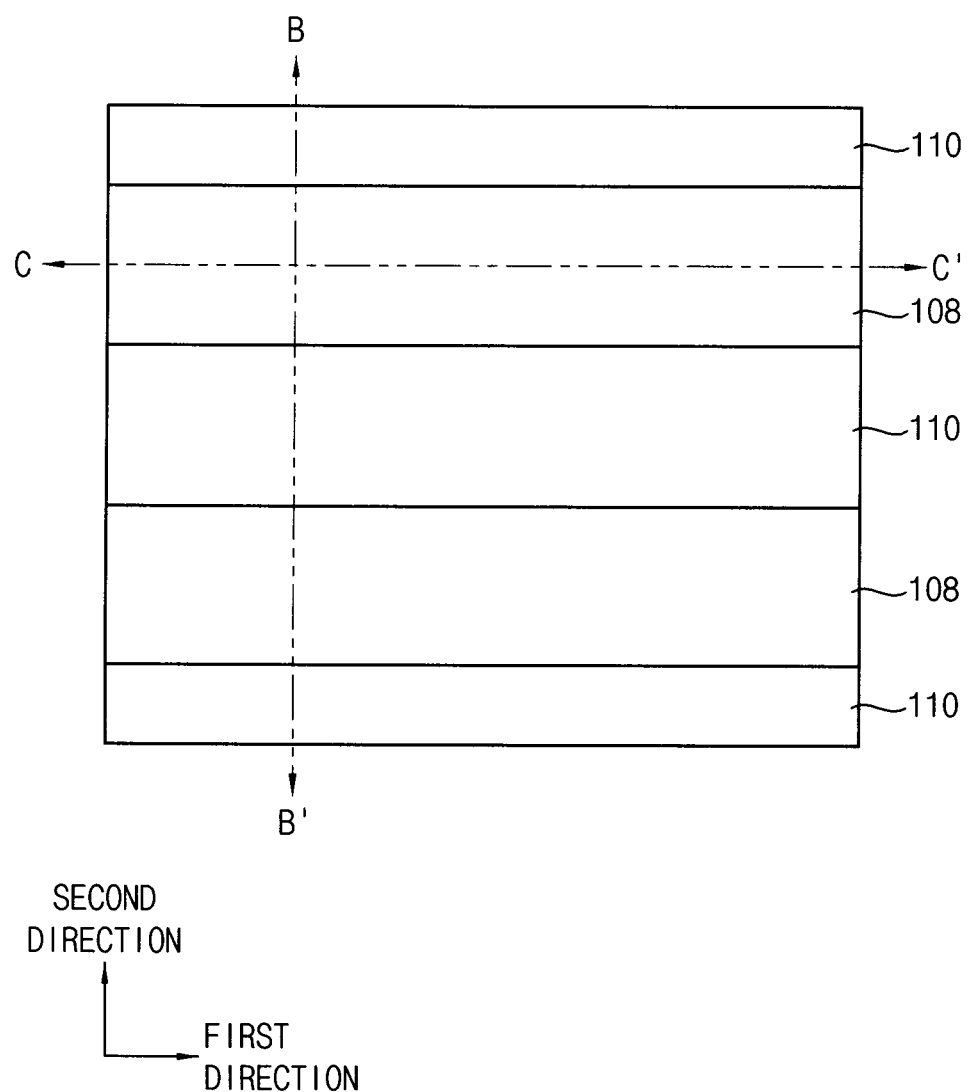

Referring to FIGS. 7 and 8, a hard mask (not shown) extending in the first direction may be formed on an uppermost semiconductor layer 104. The semiconductor layer 104, sacrificial layer 102 and an upper portion of the substrate 100 may be etched using the hard mask to form an active region 100a and a line structure.

The active region 100a may be formed on the substrate 100, and the active region 100a may extend in the first direction. The line structure may be formed on the active region 100a. The line structure may include sacrificial lines 106 and semiconductor lines 108 alternately and repeatedly stacked on the active region. In example embodiments, a plurality of line structures are arranged to be spaced apart from each other in the second direction.

An isolation pattern 110 may be formed on the substrate 100 to cover a portion of a sidewall of the active region 100a. Further, the hard mask may be removed.

Figure 9:
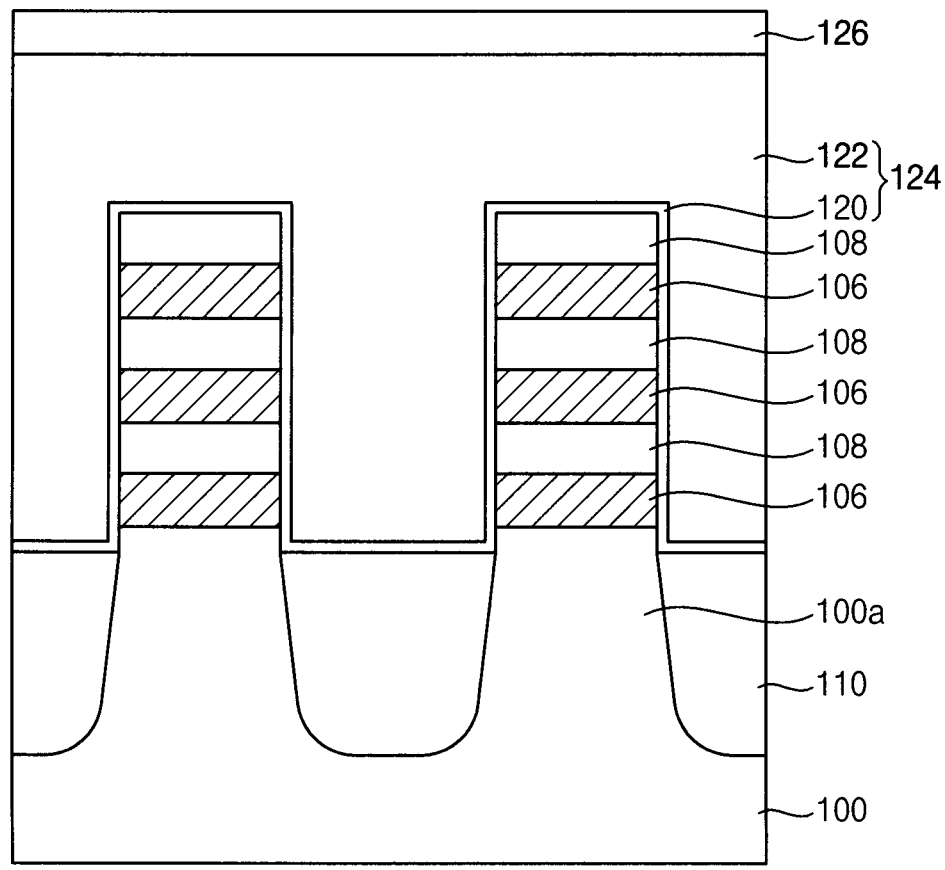

Referring to FIGS. 9 to 11, a dummy gate structure 124 and a dummy hard mask 126 extending in the second direction may be formed on the line structure and the isolation pattern 110.

In example embodiments, the dummy gate structure 124 may include a dummy gate insulation layer 120 and a dummy gate pattern 122. The dummy gate insulation layer 120 may be an oxide such as, silicon oxide, and the dummy gate pattern 122 may be, e.g., polysilicon. The dummy hard mask 126 may be, e.g., silicon nitride. These dummy patterns are described as dummy patterns because they will later be removed (as discussed below) and replaced with other patterns that remain in the final product.

In example embodiments, the dummy gate structure 124 may be formed at a top surface and at sidewalls in the second direction of each of the line structures and in a space between the line structures in the second direction.

In example embodiments, a plurality of dummy gate structures 124 are spaced apart from each other in the first direction.

Figure 12:
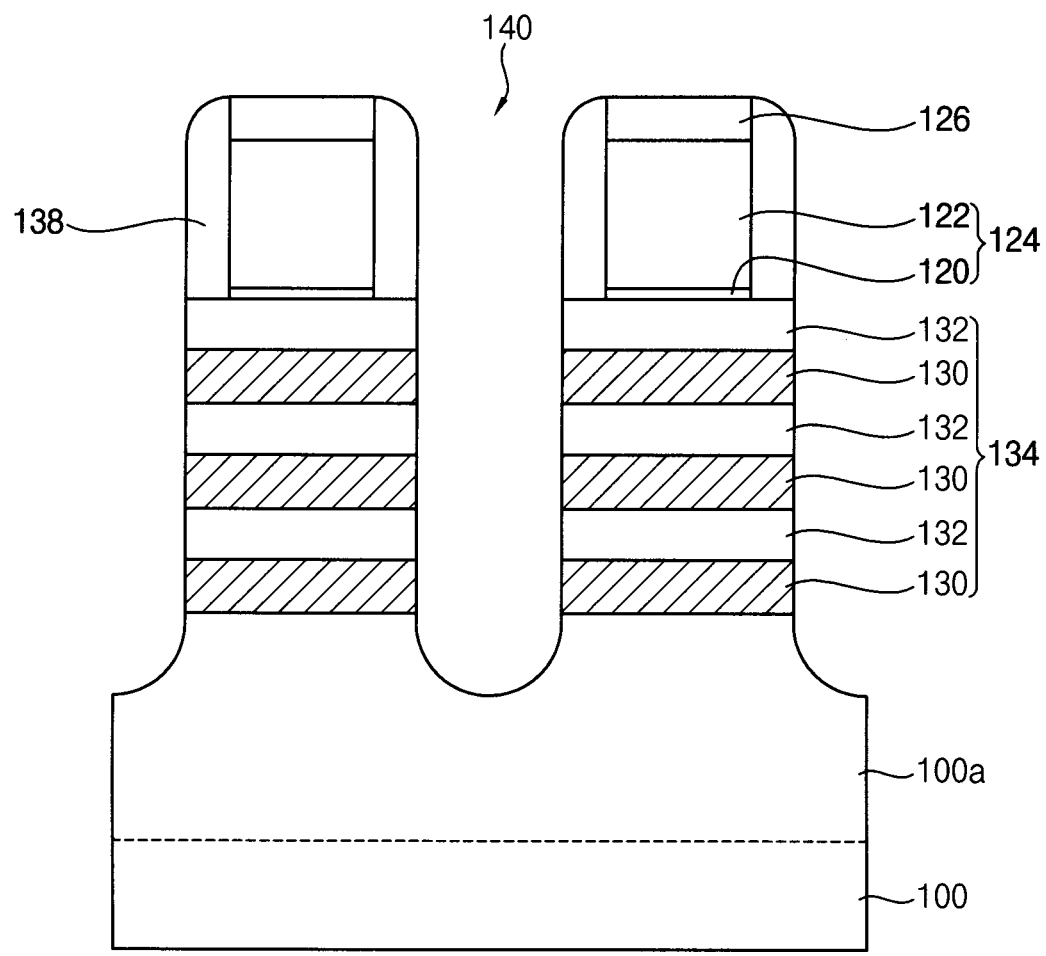
Figure 13:
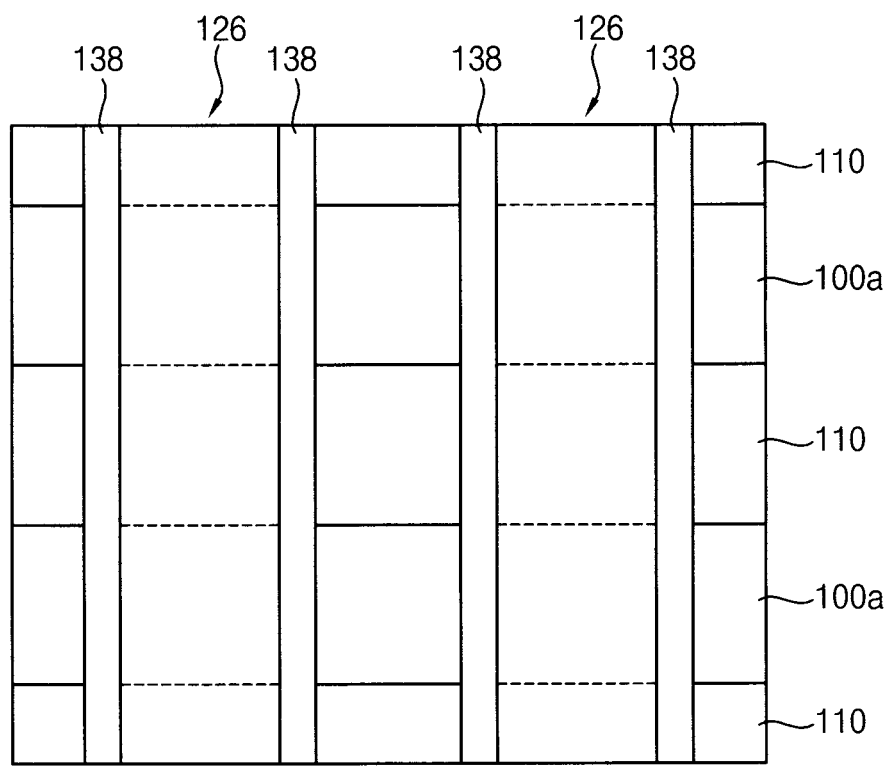

Referring to FIGS. 12 and 13, a second spacer 138 may be formed on sidewalls of the dummy gate structure 124 and the dummy hard mask 126.

Particularly, a second spacer layer may be formed on the substrate 100 on which the line structure, the isolation pattern 110, the dummy gate structure 124, and the dummy hard mask 126 are formed. The second spacer layer may be anisotropically etched to form a second spacer 138.

The line structures may be etched using the dummy hard mask 126, the dummy gate structure 124 and the second spacers 138 as an etch mask, so that an upper surface of the active region 100a is exposed.

Therefore, the sacrificial lines 106 and the semiconductor lines 108 formed under the dummy gate structure 124 and the second spacers 138 may be cut to form preliminary sacrificial patterns 130 and preliminary semiconductor patterns 132, respectively. Also, a first structure 134 including the preliminary sacrificial patterns 130 and the preliminary semiconductor patterns 132 stacked may have a pillar shape. The first structures 134 may be spaced apart from each other in each of the first and second directions.

A first opening 140 may be formed between the first structures 134 spaced apart from each other in the first direction. Sidewalls of the preliminary sacrificial patterns 130 and the preliminary semiconductor patterns 132 may be exposed by the first openings 140.

Figure 14:
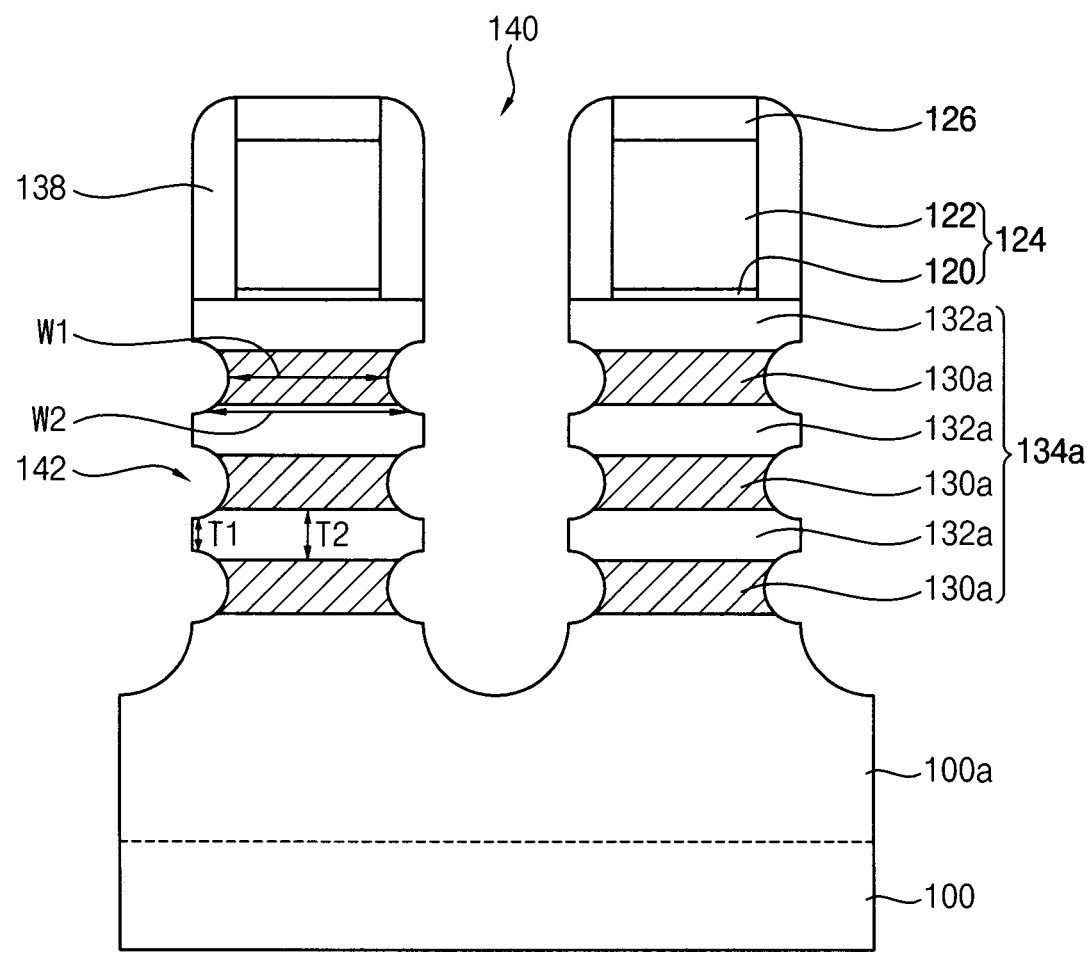

Referring to FIG. 14, both (e.g., opposite) sidewalls of the preliminary sacrificial patterns 130 exposed by the first openings 140 may be partially etched to form a first recess 142.

During etching process for forming the first recess 142, an upper surface and a lower surface at an edge of the preliminary semiconductor pattern 132 may be etched together by an etching source for etching of the preliminary sacrificial pattern 130. Thus, a second structure 134a including the sacrificial patterns 130a and the semiconductor patterns 132a stacked may be formed.

The etching process may include an isotropic etching process. In example embodiments, the etch process may include wet etching or isotropic dry etching.

When the isotropic etching process is performed, the preliminary sacrificial pattern 130 may be etched by an etchant or etchant gas continuously flowing from an outer-wall of the preliminary sacrificial pattern 130. Thus, an amount of etching of the outer wall of the preliminary sacrificial pattern 130 may be large, and the amount of etching may be decreased toward an inner side of the preliminary sacrificial pattern 130. The inner side of the preliminary sacrificial pattern 130 may be a central portion in the first direction of the preliminary sacrificial pattern 130.

Therefore, a central portion of the sacrificial pattern 130a in the vertical direction may have a width W1 in the first direction less than a width W2 in the first direction of the sacrificial pattern 130a of the upper and lower portions. In example embodiments, a width of the sacrificial pattern 130a in the first direction may gradually decrease from the upper and lower surfaces thereof toward the central portion thereof.

During etching process for forming the first recess, the upper surface and the lower surface at edges of the preliminary semiconductor pattern 132 may be etched together. Thus, a first thickness in the vertical direction of both ends of the semiconductor pattern 132a T1 may be less than a second thickness T2 in the vertical direction of the central portion of the semiconductor pattern 132a in the first direction.

In example embodiments, the first recess 142 may have a concave rounded shape toward the central portion of the sacrificial pattern 130a in the first direction.

In example embodiments, as the first recesses 142 are formed, the width of the sacrificial pattern 130a in the first direction (e.g., an average, minimum, or maximum width in the first direction) may be less than the width of the semiconductor pattern 132a in the first direction (e.g., a respective average, minimum, or maximum width in the first direction).

FIGS. 16, 19, 22 and 26 are perspective views of portions under the dummy gate structure.

Figure 15:
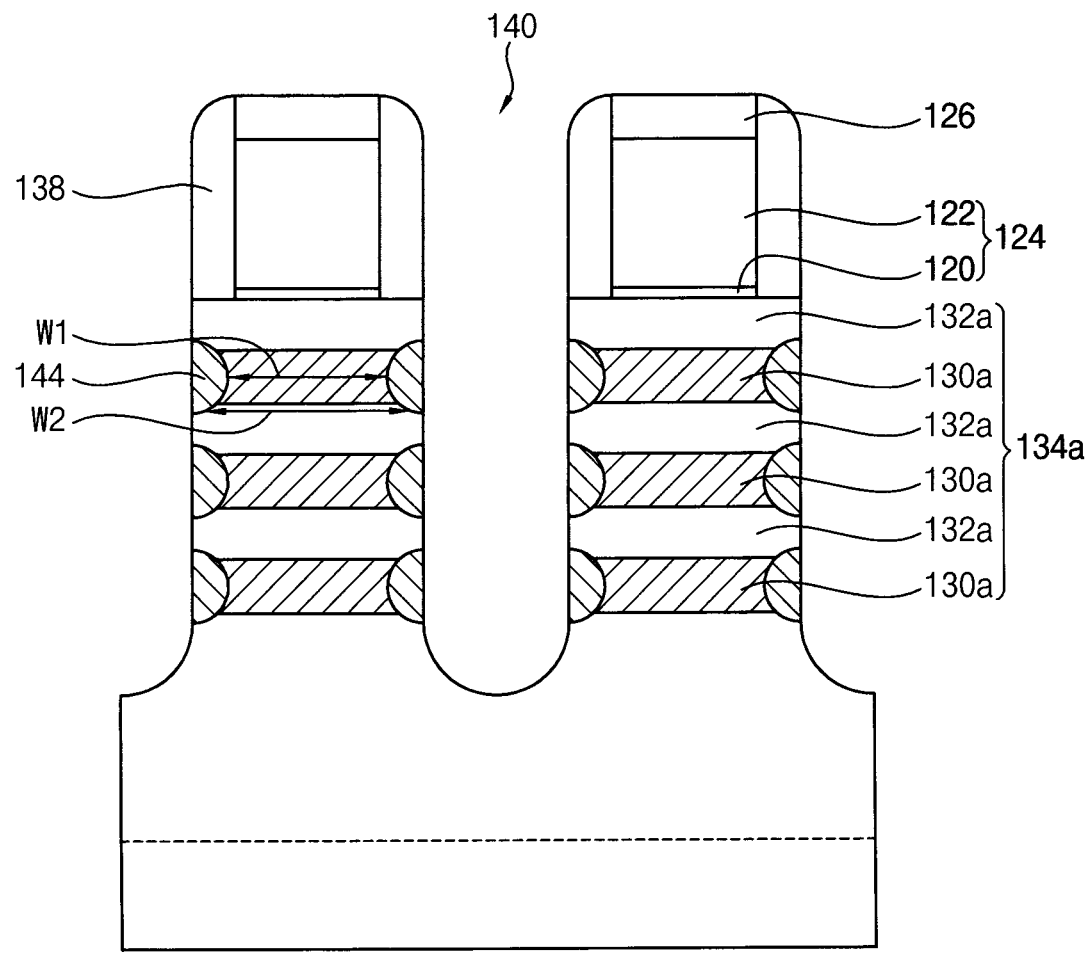
Figure 16:
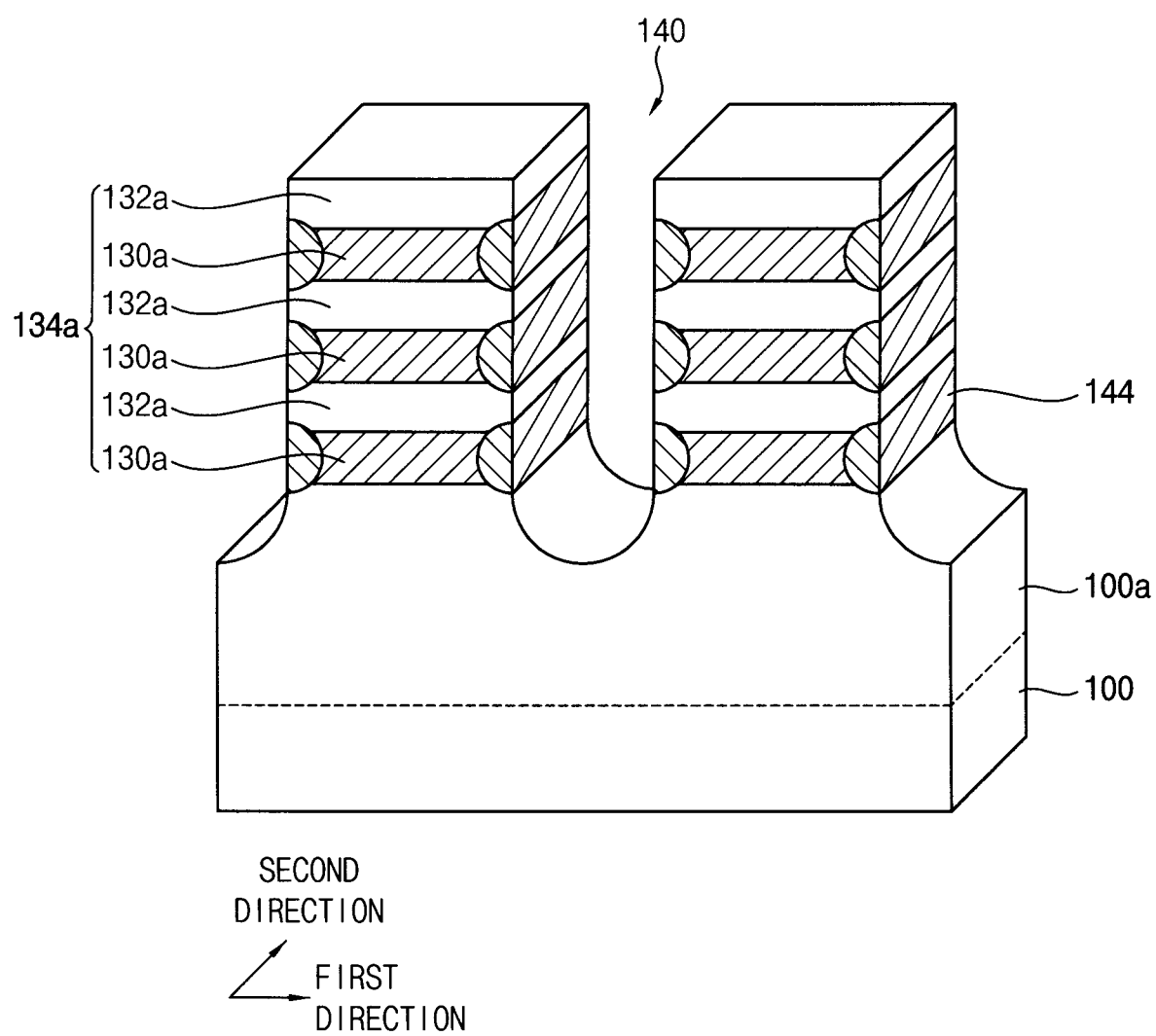

Referring to FIGS. 15 and 16, a first spacer 144 may be formed in each of the first recesses 142.

Particularly, a first spacer layer may be conformally formed on the dummy gate structure 124, the dummy hard mask 126, the second spacer 138, the second structure 134a, the active region 100a, and the isolation pattern to fill the first recesses 142. The spacer layer may be anisotropically etched to form the first spacer 144. The first spacer layer may be formed by a deposition process such as a chemical vapor deposition (CVD) process, an atomic layer deposition (ALD) process, or the like. The first spacer 144 may refer to all of the spacers (e.g., a set of first spacers) formed on a particular sidewall during the etching process, or may refer to a single first spacer 144 formed at a particular vertical level to contact an individual sacrificial pattern 130a.

In example embodiments, the first spacer 144 may be positioned only in the first recess 195. Therefore, the sacrificial patterns 130a are not exposed by sidewalls of the second structure 134a in the first direction, and only the semiconductor patterns 132a are exposed by and at the sidewalls of the second structure 134a.

In example embodiments, outer walls of each first spacer 144 are aligned with the sidewalls of the semiconductor pattern 132a in the vertical direction (e.g., to be coplanar). Alternatively, the outer walls of each first spacer 144 may protrude from the sidewalls of the semiconductor pattern 132a in the first direction. Thus, the semiconductor patterns 132a may be exposed by a sidewalls of the second structure 134a in the first direction. When the outer walls of the first spacers 144 protrude from the sidewalls of the semiconductor pattern 132a in the first direction, the semiconductor devices shown in FIG. 4B may be manufactured by performing subsequent processes in the same manner.

Figure 17:
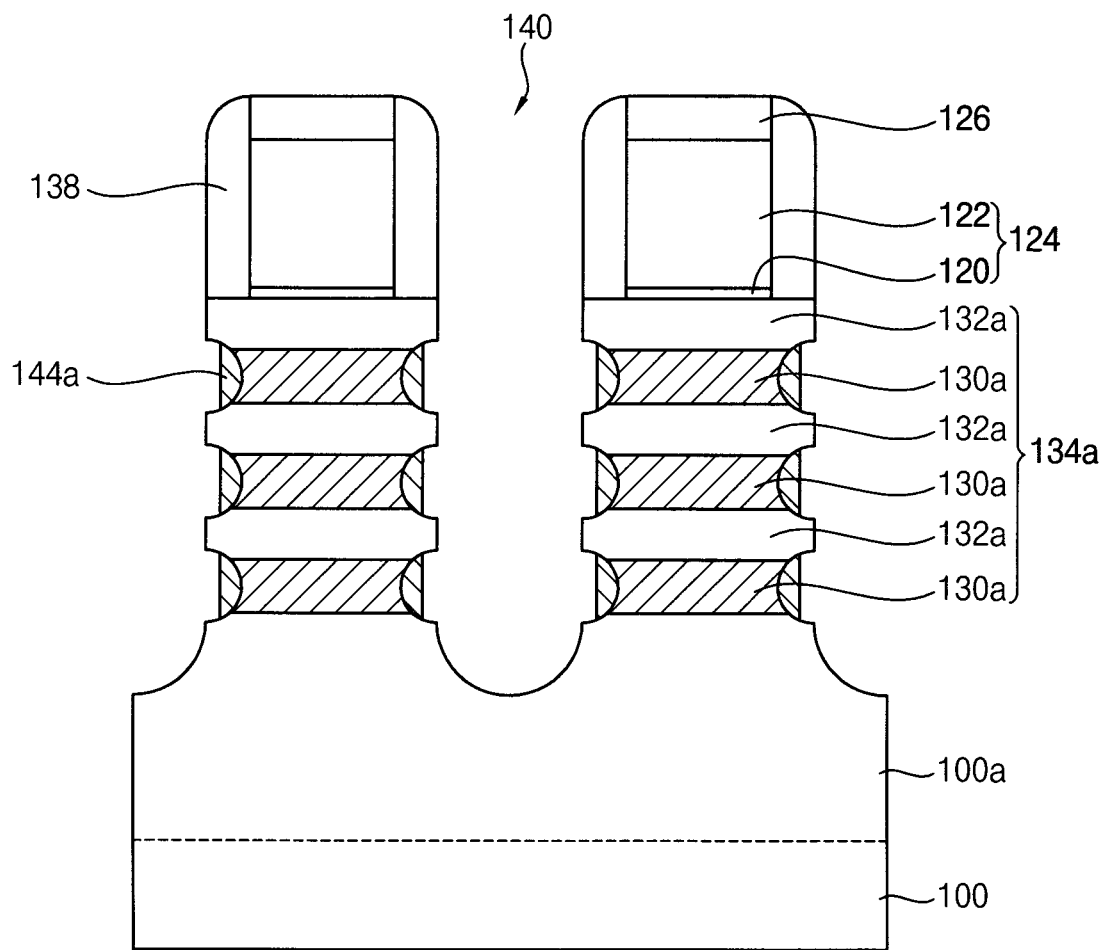

In some example embodiments, as shown in FIG. 17, the outer wall of the first spacer 144a may be inwardly recessed from the sidewalls of the semiconductor pattern 132a. For example, the sidewalls of the semiconductor pattern 132a may protrude from the outer wall of the first spacer 144a in the first direction. Thus, the sidewalls, the lower surface and the upper surface of the edges of the semiconductor patterns 132a may be exposed at the sidewalls of the second structure 134a in the first direction. The first spacer 144a may be formed, and then subsequent processes may be performed in the same manner to form the semiconductor device shown in FIG. 4A.

Figure 18:
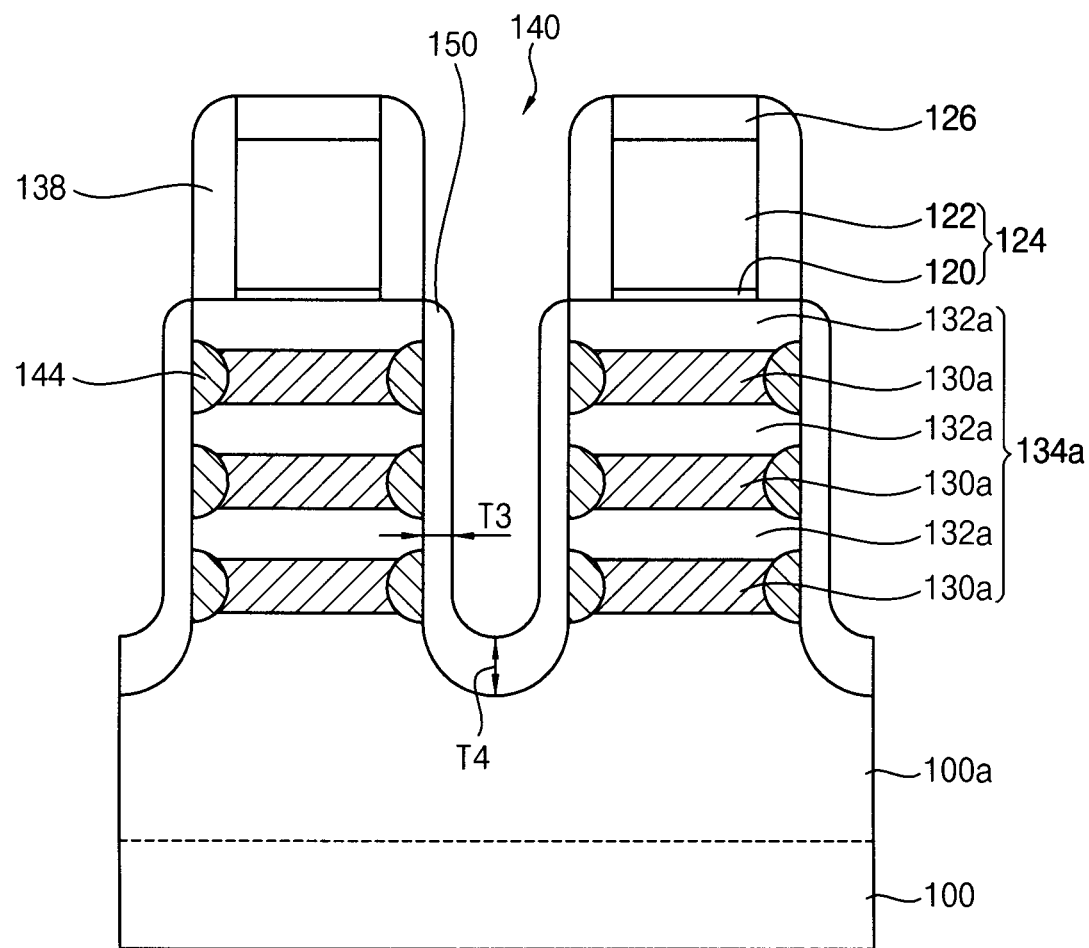
Figure 19:
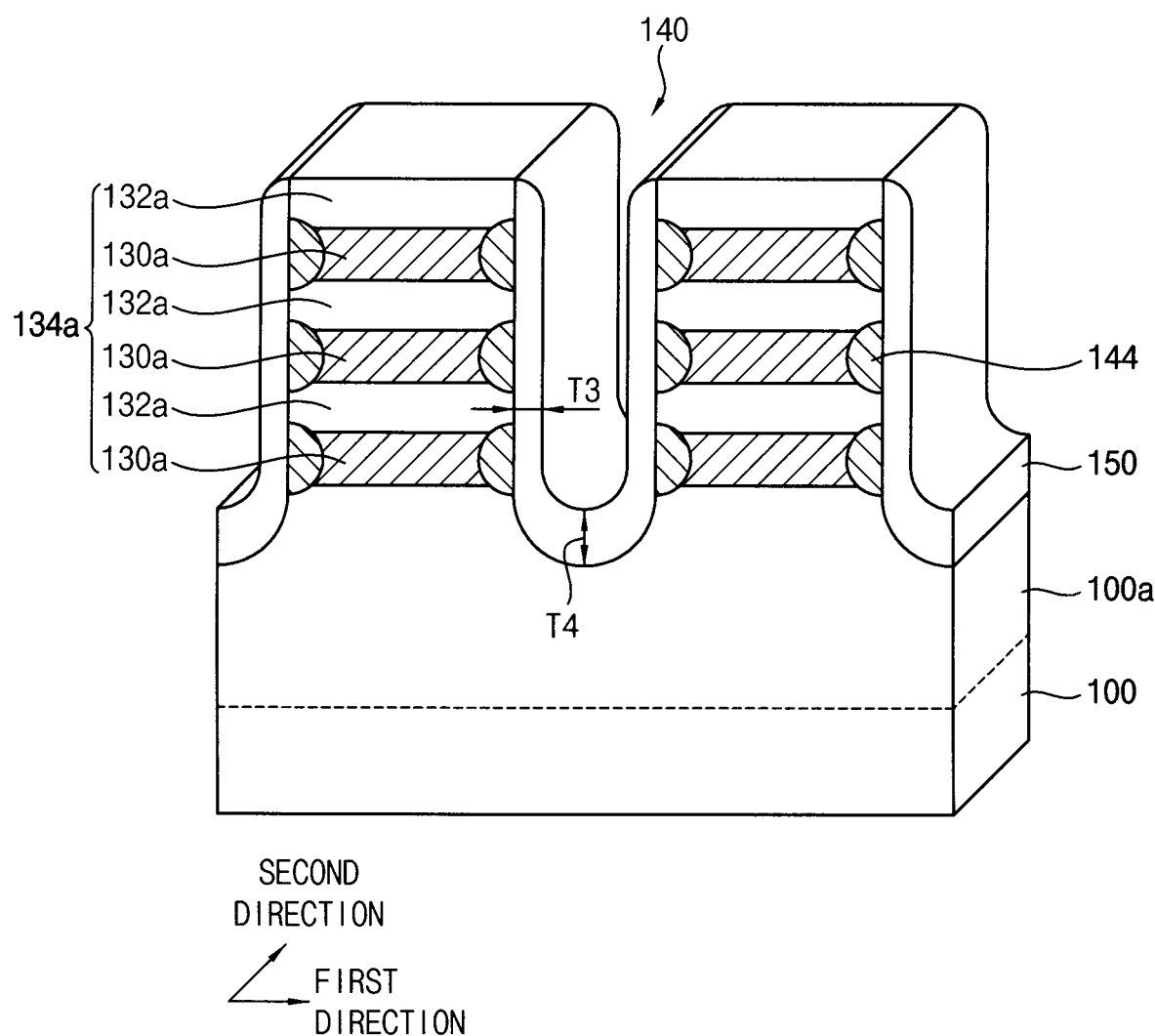

In FIGS. 18 and 19, the first semiconductor layer 150 is formed to cover the semiconductor pattern 132a, the first spacer 144, and the active region 100a exposed by the first opening 140.

The first semiconductor layer 150 may be formed by a selective epitaxial growth process (SEG) while in situ doped with impurities to have a first impurity concentration.

In example embodiments, the first semiconductor layer 150 may be formed by performing a first SEG process using the surfaces of the active region 100a and the semiconductor pattern 132a exposed by the first opening 140 as a seed.

For example, in the first SEG process, the semiconductor layer may be grown from an upper surface of the active region 100a and the surface of the semiconductor pattern 132a. Further, the semiconductor layer grown from the surface of the semiconductor pattern 132a may flow down in the vertical direction, and an additional layer may be rapidly grown in the vertical direction from the grown semiconductor layer. Thus, the first semiconductor layer 150 may be continuously formed on the surfaces of the semiconductor pattern 132a, the first spacer 144 and the active region 100a exposed by the first opening 140.

In example embodiments, when the first spacer 144 has a structure as shown in FIGS. 15 and 16, the semiconductor layer may be grown from the sidewalls of the semiconductor pattern 132a in the first direction, and the semiconductor layer may flow down in the vertical direction.

In example embodiments, when the first spacer 144a has a structure as shown in FIG. 17, the semiconductor layer is grown from upper and lower surfaces of the sidewalls and the edge of the semiconductor pattern 132a in the first direction, and the semiconductor layer may flow down in the vertical direction.

In example embodiments, the first semiconductor layer 150 formed on the sidewalls of the semiconductor patterns 132a and the first spacers 144 may have a third thickness T3 in the first direction. The first semiconductor layer 150 formed on an upper surface of the active region 100a may have a fourth thickness T4 in the vertical direction greater than the third thickness T3.

The first SEG process may be performed under a first pressure and a first temperature using a semiconductor source gas and a purge gas. The purge gas may be introduced at a first flow rate.

In example embodiments, the first pressure may be in range of about 300 Torr to about 700 Torr. The first temperature may be in range of about 550° C. and about 750° C. The purge gas may include nitrogen and/or hydrogen. For example, the first flow rate may be in range of about 10000 sccm (standard cubic centimeters per minute) to about 30000 sccm.

For example, the first SEG process may be performed at a high pressure, so that the amount of the semiconductor source gas stagnated in a deposition chamber may be increased. Therefore, the first semiconductor layer 150 may be grown to be merged in the vertical direction, and the first semiconductor layer 150 may easily flow down in the vertical direction. Also, as the flow rate of the purge gas is increased, the first semiconductor layer 150 may be suppressed from growing upward.

In example embodiments, the first semiconductor layer 150 may be formed to include silicon doped with n-type impurities. For example, the first SEG process may use a silicon source gas, such as disilane ($Si_2H_6$) gas. In this case, the first semiconductor layer 150 may serve as a source/drain extension region of an NMOS transistor.

In some example embodiments, the first semiconductor layer 150 may be formed to include silicon germanium doped with p-type impurities. For example, the first SEG process may use a germanium source gas such as a $GeH_4$ gas and a silicon source gas such as dichlorosilane ($SiH_2Cl_2$) gas. In this case, the first semiconductor layer 150 may serve as a source/drain extension region of a PMOS transistor.

Figure 20:
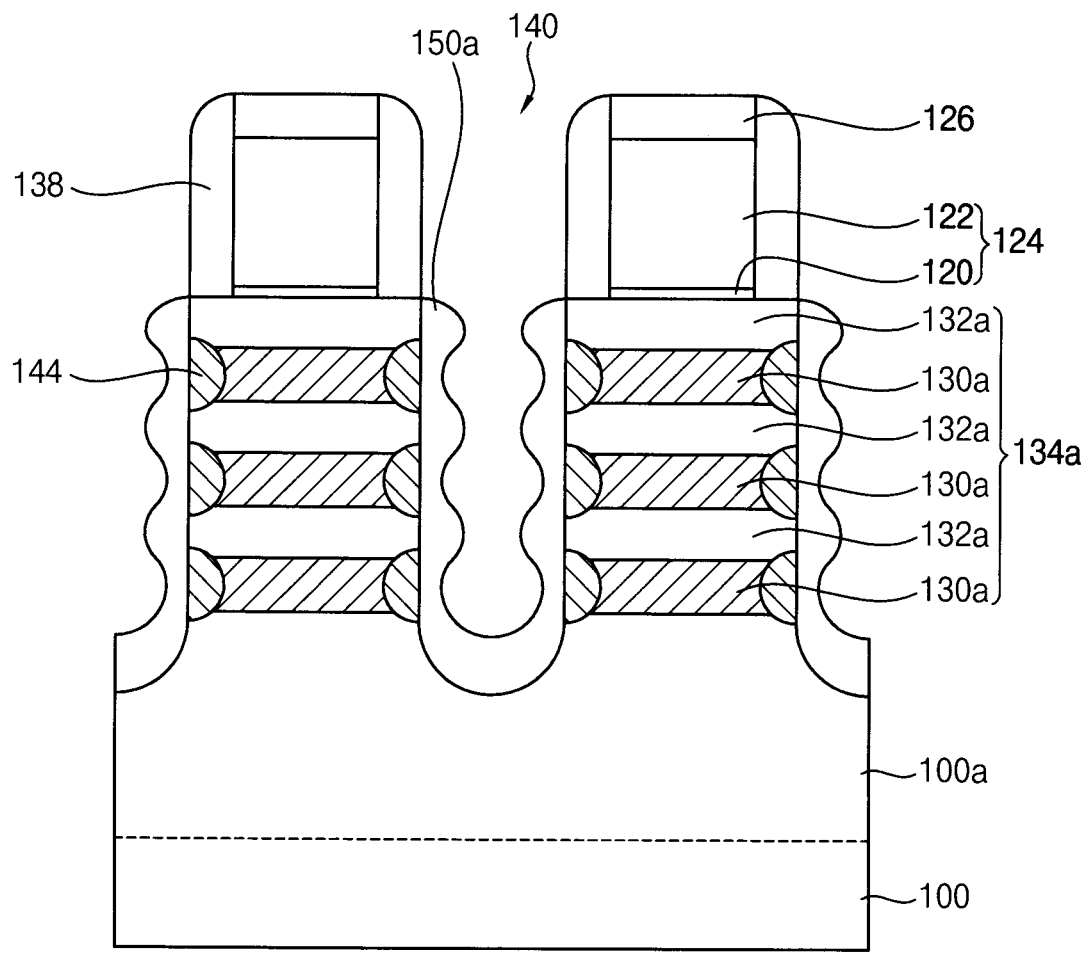

A shape of the first semiconductor layer 150 may vary depending on process conditions of the first SEG process. In example embodiments, as shown in FIG. 20, the thickness in the first direction of the first semiconductor layer 150*a* formed on the sidewalls of the semiconductor patterns 132*a* and the first spacers 144 in the first direction may not be uniform. For example, a thickness of the first semiconductor layer 150*a* formed on the semiconductor patterns 132*a* may be greater than a thickness of the first semiconductor layer 150*a* formed on the first spacers 144. In this case, the semiconductor device shown in FIG. 3 may be manufactured by subsequent processes in the same manner. Even in this situation, however, the maximum thickness of the first semiconductor layer 150*a* in a direction perpendicular to a sidewall of the second structure 134*a* (e.g., in the first direction) may be smaller than a maximum thickness of the first semiconductor layer 150*a* in a direction perpendicular a surface of the active layer 100*a* where the first semiconductor layer 150*a* contacts the active layer 100*a* (e.g., in a vertical direction).

Figure 21:
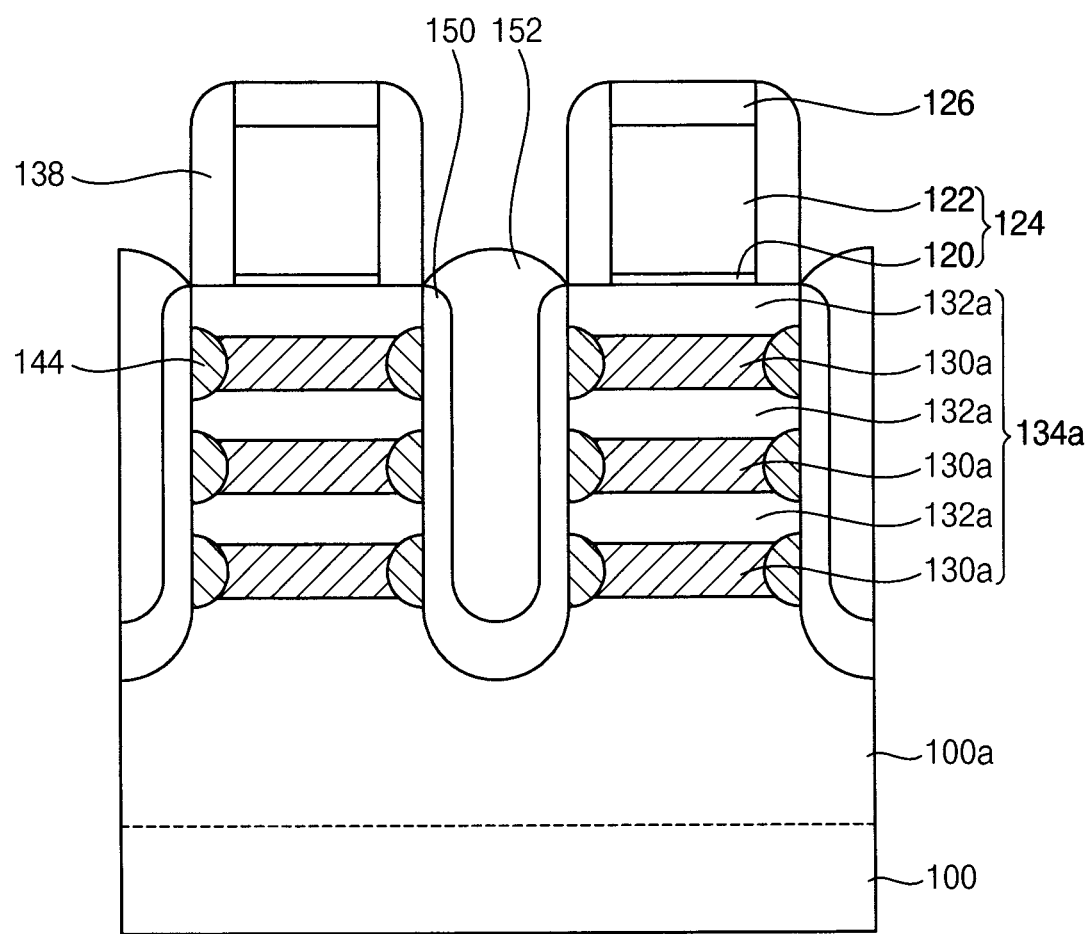
Figure 22:
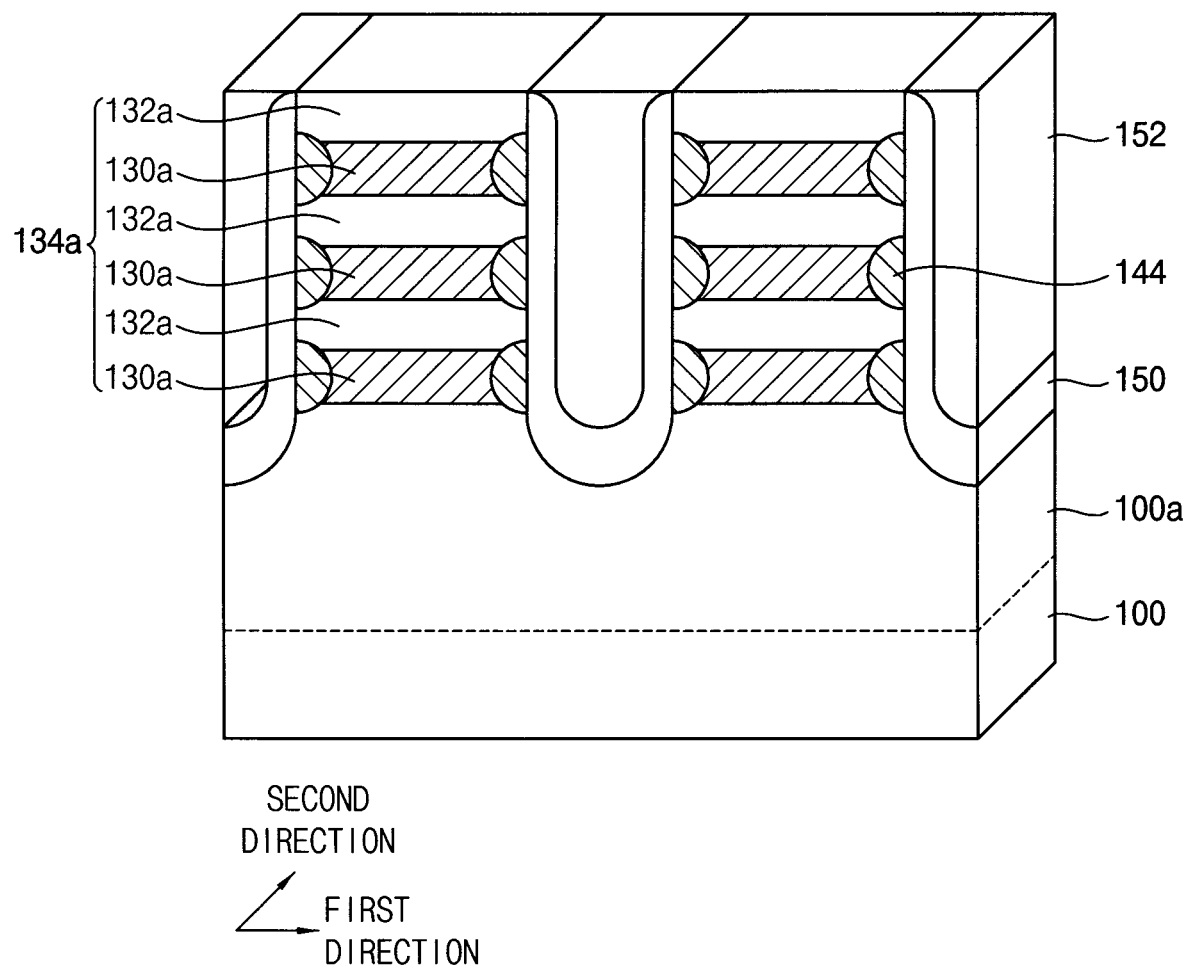
Figure 23:
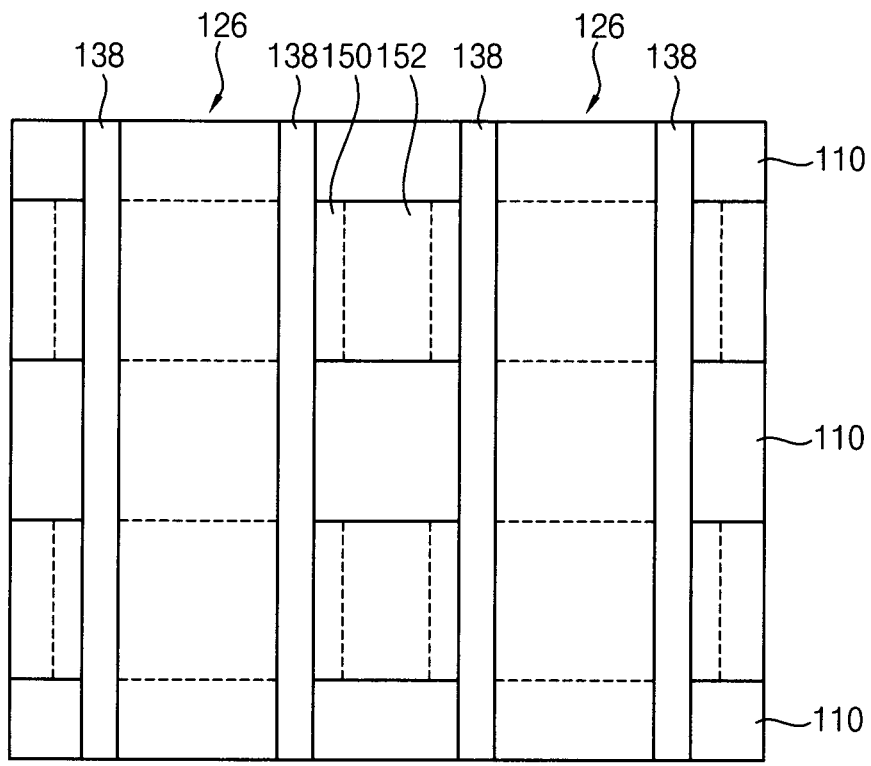
Figure 23:
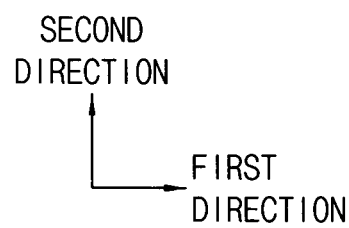

Referring to FIGS. 21 to 23, the second semiconductor layer 152 may be formed on the first semiconductor layer 150. The second semiconductor layer 152 may be doped with impurities to have a second impurity concentration higher than the first impurity concentration. In example embodiments, the second semiconductor layer 152 may be doped with the impurities having a conductivity type the same as a conductivity type of the impurities of the first semiconductor layer 150. In example embodiments, the second semiconductor layer 152 may include a material and/or material composition the same as the material or material composition of the first semiconductor layer 150.

In example embodiments, the second semiconductor layer 152 fills a space between the second structures 134*a* spaced apart from each other in the first direction.

The second semiconductor layer 152 may be formed by a second selective epitaxial growth process while in situ doped with impurities to have the second impurity concentration.

In example embodiments, the second SEG process may be performed under process conditions different from process conditions of the first SEG process. For example, the second SEG process may be performed using semiconductor source gas and purge gas under a second pressure lower than the first pressure. Also, the second SEG process may be performed at a second temperature. The purge gas may be introduced at a second flow rate less than the first flow rate.

In example embodiments, the second pressure may be in range of about 100 Torr to about 300 Torr. The second temperature may be in range of about 550° C. and about 750° C. The second temperature may be the same as or different from the first temperature. For example, the second flow rate may be in range of about 5000 sccm to about 10000 sccm. In this case, the second semiconductor layer 152 may be grown using the surface of the first semiconductor layer 150 as a seed, and the grown semiconductor layer may not flow down in the vertical direction.

In some example embodiments, the second SEG process may be performed under process conditions the same as process conditions of the first SEG process, except for the doping concentration of impurities. In this case, the second semiconductor layer 152 may be grown using the surface of the first semiconductor layer 150 as a seed, and the grown semiconductor layer may flow down in the vertical direction.

In example embodiments, the second semiconductor layer 152 may be formed to include silicon doped with n-type impurities having the second impurity concentration. In this case, the second semiconductor layer 152 may serve as a source/drain region of an NMOS transistor.

In some example embodiments, the second semiconductor layer 152 may be formed to include silicon germanium doped with p-type impurities having the second impurity concentration. In this case, the second semiconductor layer 152 may serve as a source/drain region of a PMOS transistor.

Figure 24:
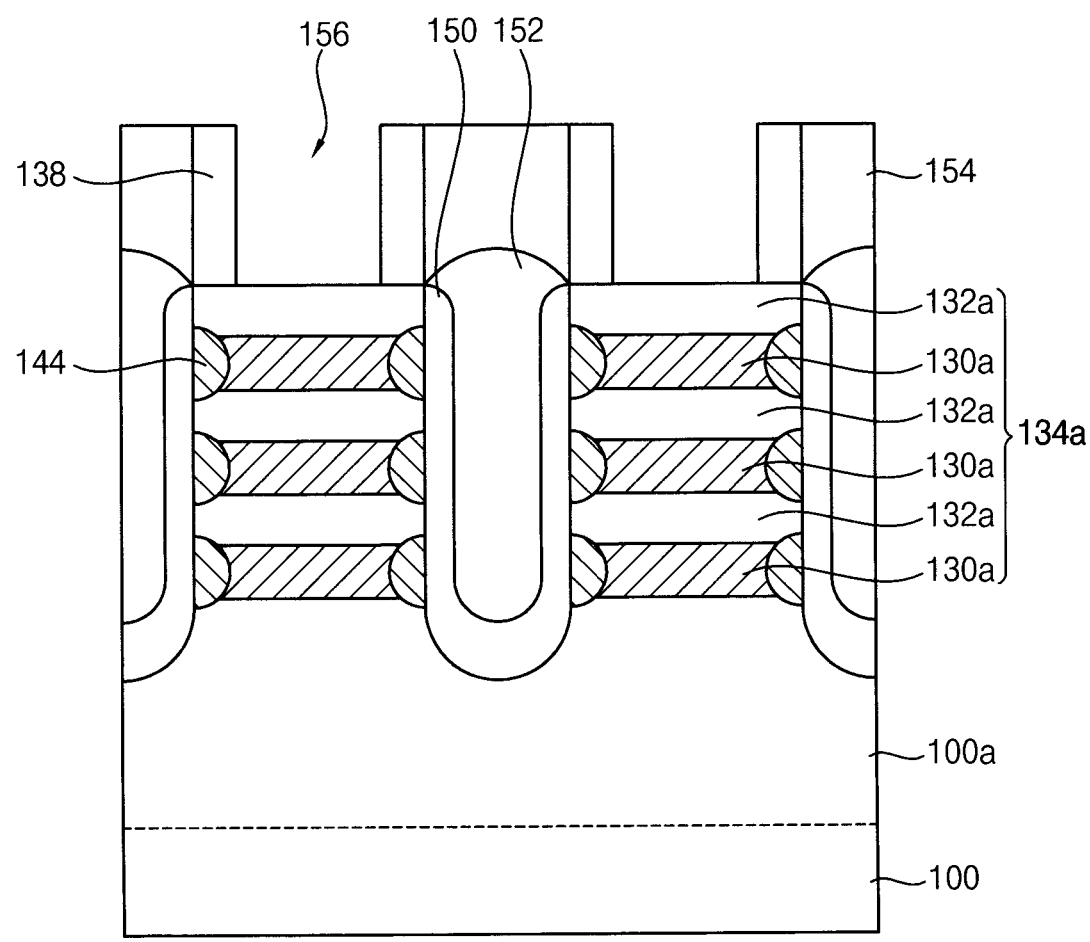

Referring to FIG. 24, an insulation layer 154 may be formed to cover the second structure 134*a*, and the first and second semiconductor layers 150 and 152, and the insulation layer 154 may be planarized until an upper surface of the dummy gate structure 124 is exposed. During the planarization process, the dummy hard mask 126 may be removed together, and the upper portion of the second spacer 138 may be partially removed. The planarization process may include a chemical mechanical polishing (CMP) process and/or an etch-back process.

Thereafter, the dummy gate pattern 122 and the dummy gate insulation layer 120 under the dummy gate pattern 122 are removed to form a second opening. An inner wall of the second spacer 138 and sidewalls in the second direction of the second structure 134*a*, an end surface in the second direction of the first spacer 144 and upper surfaces of the active region 100*a* and the isolation pattern 110 may be exposed by the second opening 156.

The sidewalls in the second direction of the semiconductor patterns 132*a* and the sacrificial patterns 130*a* may be exposed by the second openings 156.

Figure 25:
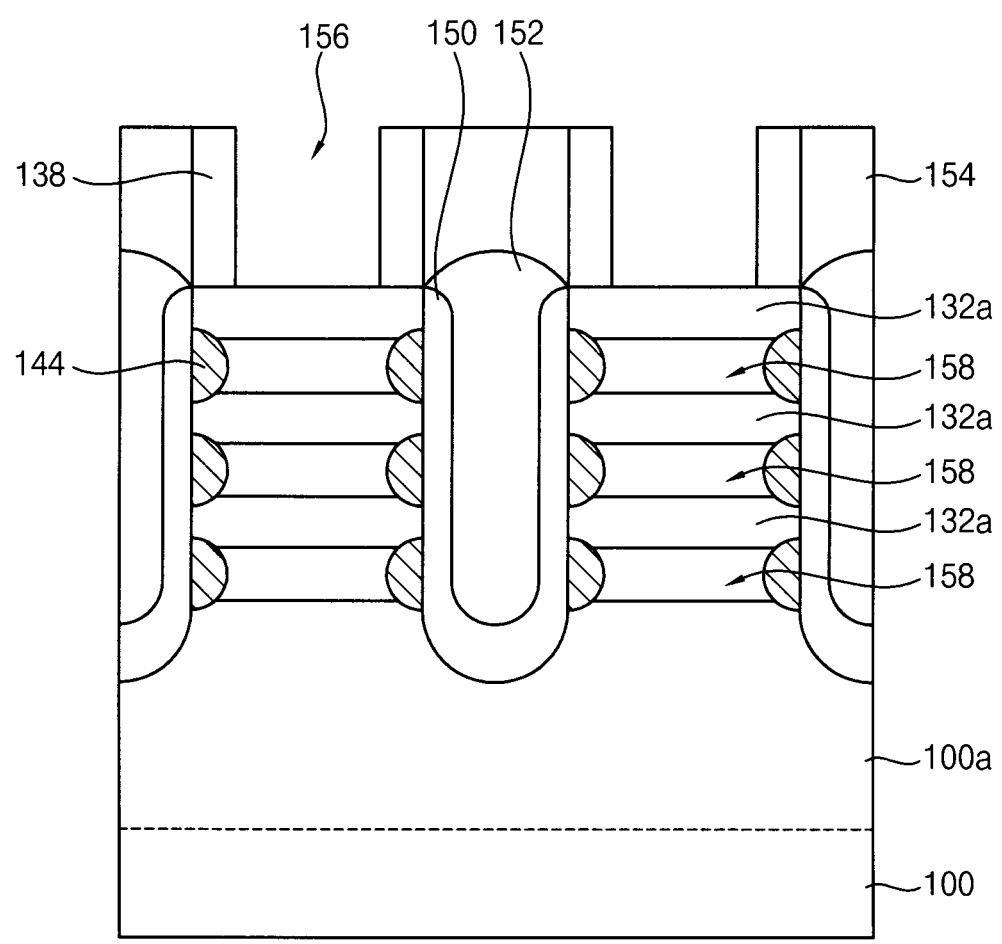
Figure 26:
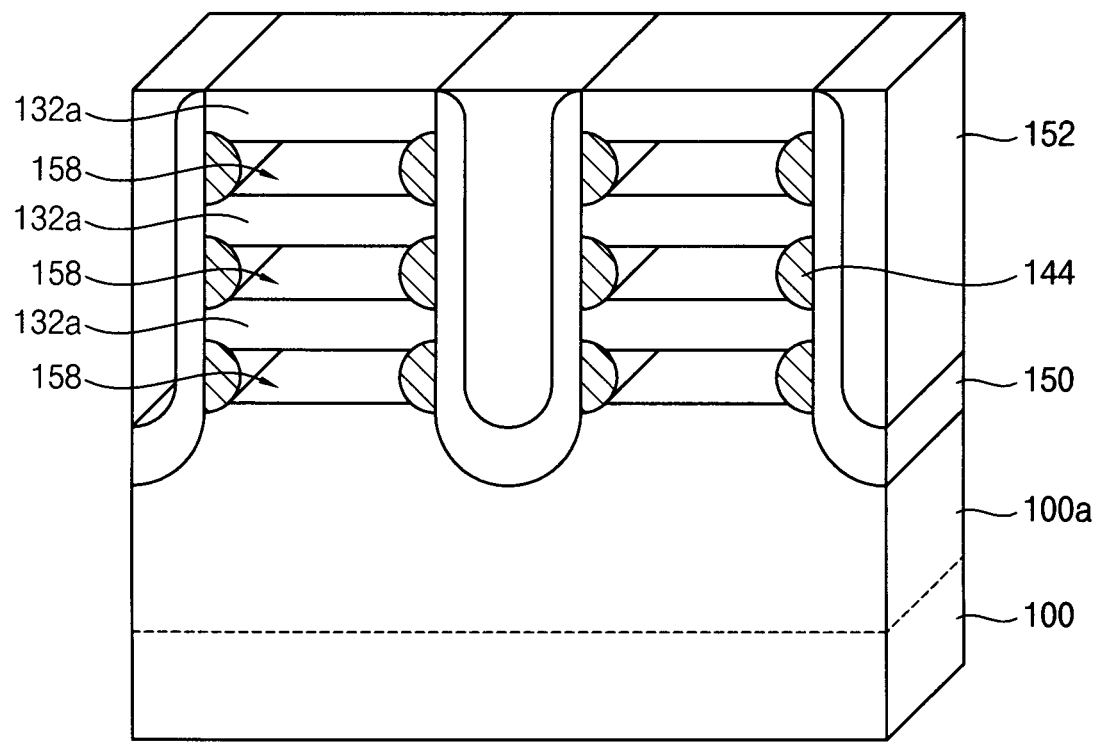
Figure 27:
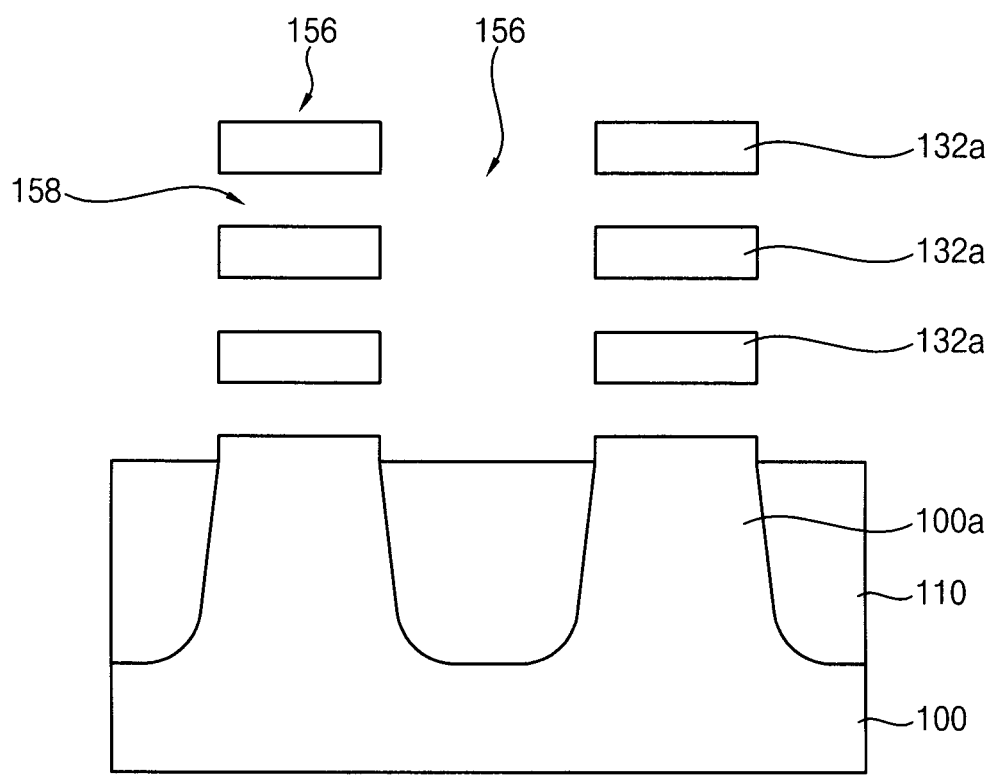

Referring to FIGS. 25 to 27, the sacrificial patterns 130*a* exposed by the second openings 156 are selectively removed to form a first gap 158. The first gap 158 is in communication with the second opening 156. Thus, the first gap 158 and the second opening 156 are merged to extend in the second direction.

The selective removing of the sacrificial patterns 130*a* may be performed by an isotropic etching process. The isotropic etching process may include a wet etching or an isotropic dry etching process.

In the etching process of the sacrificial pattern 130*a*, an etchant or etching gas may be introduced into the first semiconductor layer 150 along an interface of the first spacer 144. Particularly, the etchant or etching gas may be introduced into the first semiconductor layer 150 through the edges of the semiconductor pattern 132*a* having the first thickness and the first spacer 144.

However, the first semiconductor layer 150 may be doped with impurities having the first concentration lower than that of the second semiconductor layer 152. Therefore, an etching rate of the first semiconductor layer 150 with respect to the etchant or the etching gas may be lower than an etching rate of the second semiconductor layer 152 with respect to that. As the doping concentration of the impurity is low, damage or the etching of the first semiconductor layer 150 may not occur due to the etchant or the etching gas.

Further, as the first semiconductor layer 150 blocks the etchant or the etching gas from being introduced into the second semiconductor layer 152, the second semiconductor layer 152 may not contact the etchant or the etching gas. Therefore, the second semiconductor layer 152 may not be damaged or etched by the etchant or the etching gas. Therefore, defects such as holes in the second semiconductor layer 152 may not occur.

Referring to FIGS. 1A, 1B and 2 again, gate structures 162*a* and 162*b* may be formed on the substrate 100 to fill the second opening 156 and the first gap 158.

Particularly, an oxide layer (not shown) may be formed on the upper surface of the active region 100*a* and the surface of the semiconductor pattern 132*a* exposed by the second opening 156 and the first gap 158. A gate insulation layer may be formed conformally on the oxide layer, the inner walls of the first and second spacers 144 and 138 and the upper surface of the insulation layer 154 to form a gate electrode layer filling the second opening 156 and the first gap 158. In example embodiments, a work function control layer may be further formed between the gate insulation layer and the gate electrode layer.

Each of the gate insulation layer, the work function control layer, and the gate electrode layer may be formed by a CVD process, an ALD process, a physical vapor deposition (PVD) process, or the like.

Thereafter, the gate electrode layer, the work function control layer, and the gate insulation layer may be planarized until a top surface of the insulation layer 154 is exposed to form gate structures 162*a* and 162*b* including a gate insulation pattern 160*a*, a work function control pattern and a gate pattern 160*b*.

As described above, the first semiconductor layer 150 may cover the semiconductor pattern 132*a*, the first spacer 144 and the active region 100*a*, and the second semiconductor layer 152 may be formed on the first semiconductor layer 150. Thus, in the etching process for forming the first gap 158, the second semiconductor layer 152 may not be damaged by the etchant or the etching gas. Therefore, the semiconductor device may have high reliability.

Figure 28:
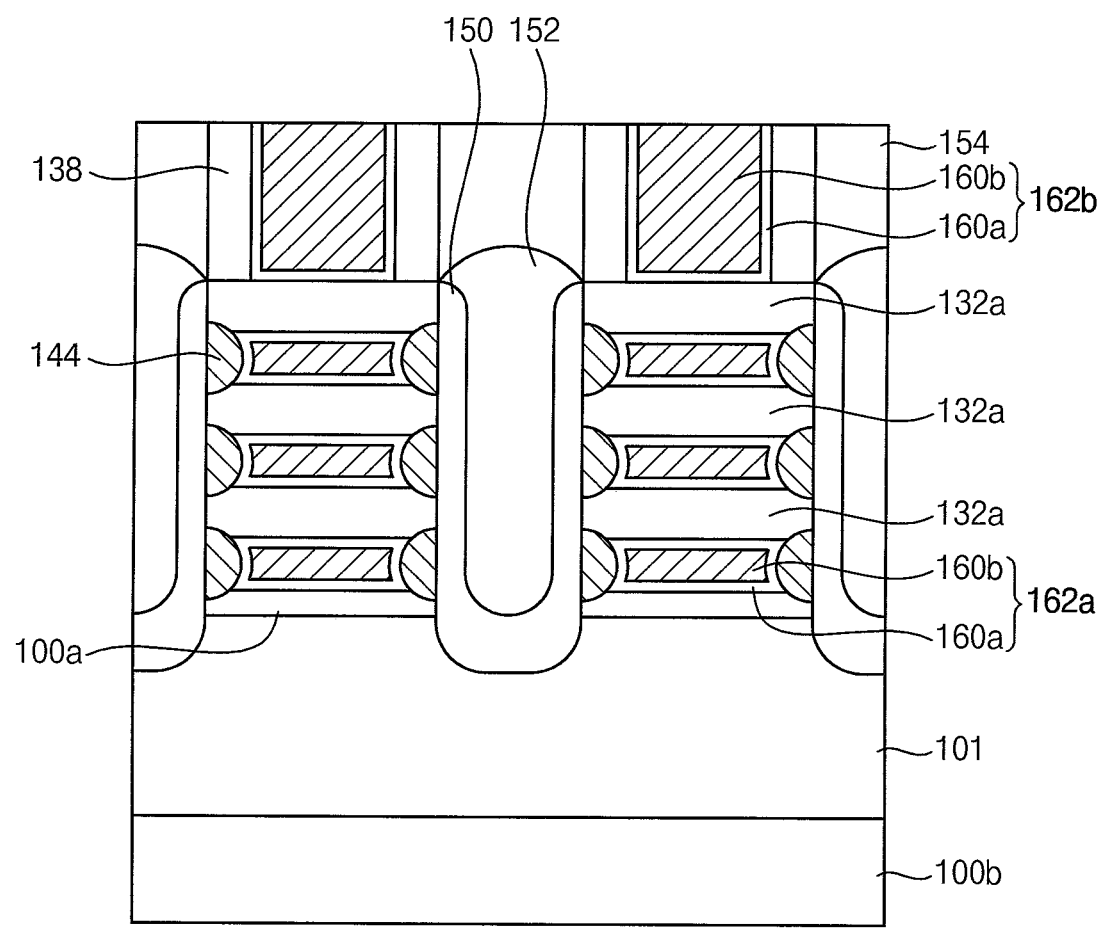
FIGS. 28 and 29 are cross-sectional views illustrating a semiconductor device in accordance with example embodiments.
Figure 29:
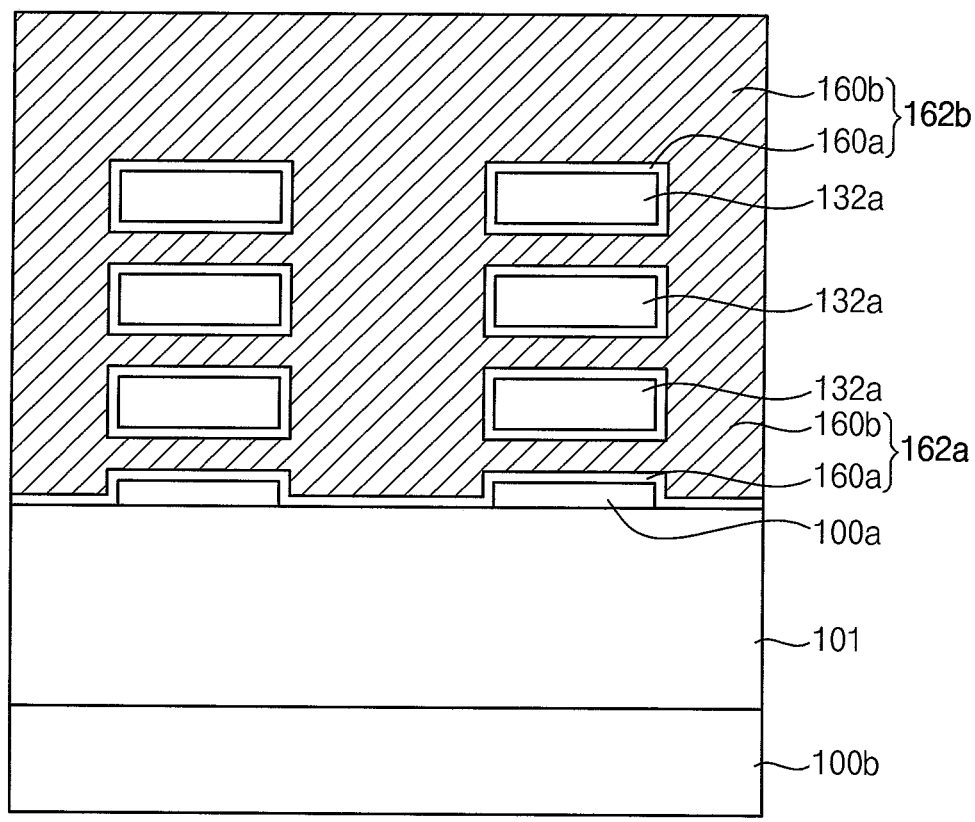

FIGS. 28 and 29 are cross-sectional views illustrating a semiconductor device in accordance with example embodiments.

FIG. 28 is a cross-sectional view of a portion of the gate pattern cut in the first direction, and FIG. 29 is a cross-sectional view of a portion of the gate pattern cut in the second direction.

The semiconductor device may be the same as or similar to the semiconductor device described with reference to FIGS. 1A, 1B, and 2, except for using a substrate including a base substrate, an insulation layer and an upper substrate stacked.

Referring to FIGS. 28 and 29, an active region 100*a* may be formed by patterning the upper substrate formed on the insulation layer. Thus, the insulation layer 101 may be disposed under the active region 100*a* and above the base substrate 100*b*.

In example embodiments, the substrate may be a silicon-on-insulator (SOI) substrate, or a germanium-on-insulator (GOI) substrate.

Figure 30:
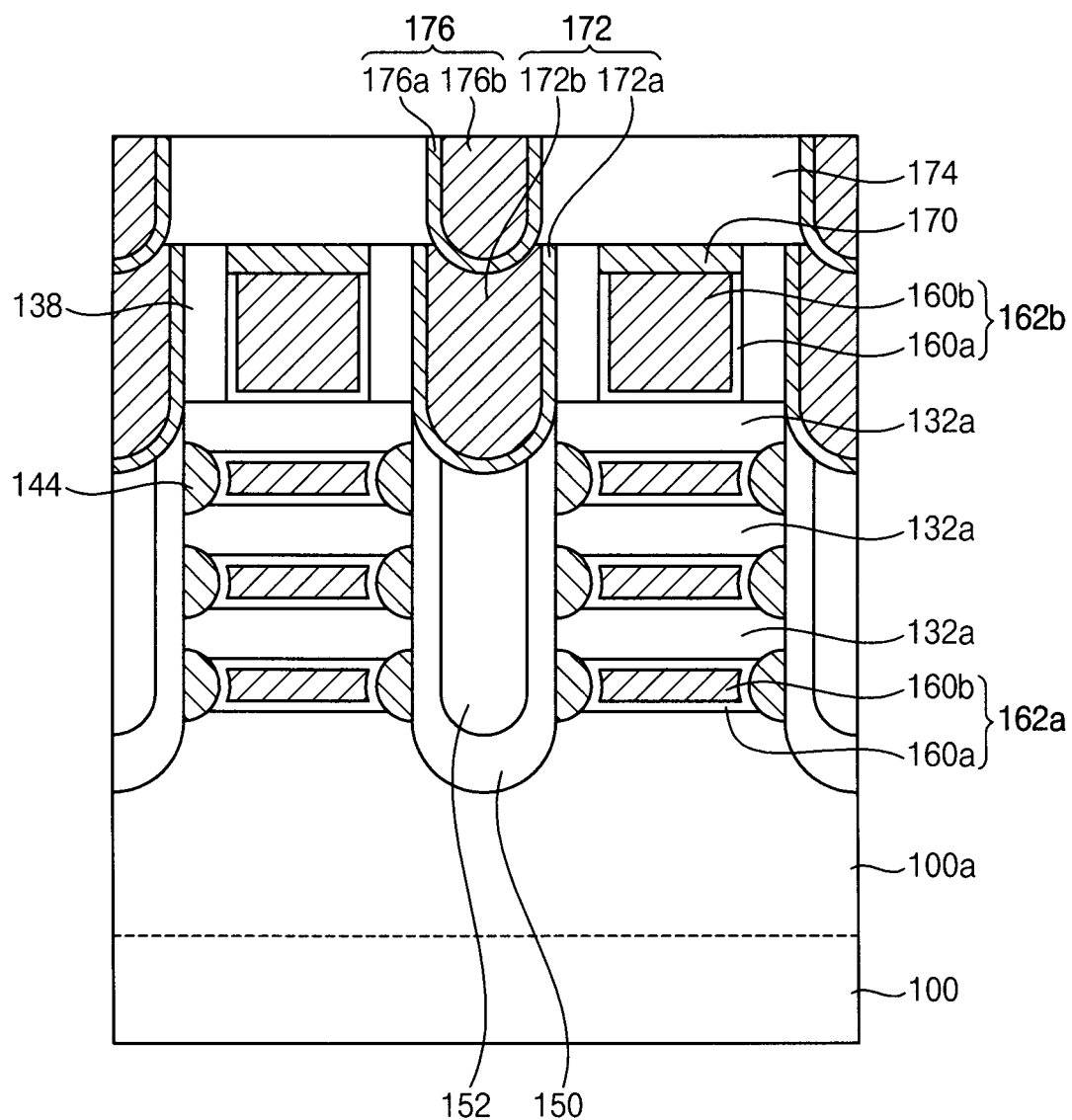
FIG. 30 is a cross-sectional view illustrating a semiconductor device in accordance with example embodiments.

FIG. 30 is a cross-sectional view illustrating a semiconductor device in accordance with example embodiments.

The semiconductor device may further include upper wirings in the semiconductor device illustrated with reference to FIGS. 1A, 1B, and 2.

Referring to FIG. 30, a capping pattern 170 may be formed to cover a top portion of the second gate structure 162*b*. The second spacers 138 may be formed on sidewalls of the structure including the second gate structure 162*b* and the capping pattern 170 stacked. The capping pattern 170 may be an insulation material, e.g., silicon nitride, silicon oxynitride.

Contact plugs 172 may pass through the insulation layers (refer to FIG. 31, 154) filling a space between the second gate structures 162*b*. The contact plug 172 may contact upper surfaces of the first and second semiconductor layers 150 and 152. The contact plug 172 may include and may be formed of a metal material. In example embodiments, the contact plug 172 may include a first barrier metal layer 172*a* and a first metal layer 172*b* stacked.

In example embodiments, a bottom surface of the contact plug 172 may be lower than a top surface of an uppermost semiconductor pattern 132*a*.

An upper insulating interlayer 174 may be formed on the capping pattern 170, the second spacers 138, and the contact plugs 172. A conductive pattern 176 may pass through the upper insulating interlayer 174. The conductive pattern 176 may contact the contact plug 172.

The conductive pattern 176 may include an be formed of a metal material. In example embodiments, the conductive pattern 176 may have a second barrier metal layer 176*a* and a second metal layer 176*b* stacked.

In example embodiments, the conductive pattern 176 may have a line shape extending in a direction. In some embodiments, the conductive pattern 176 may serve as an upper contact plug.

As described above, the semiconductor device may further include the upper wirings electrically connected to the source/drain regions of the MBCFET.

Figure 31:
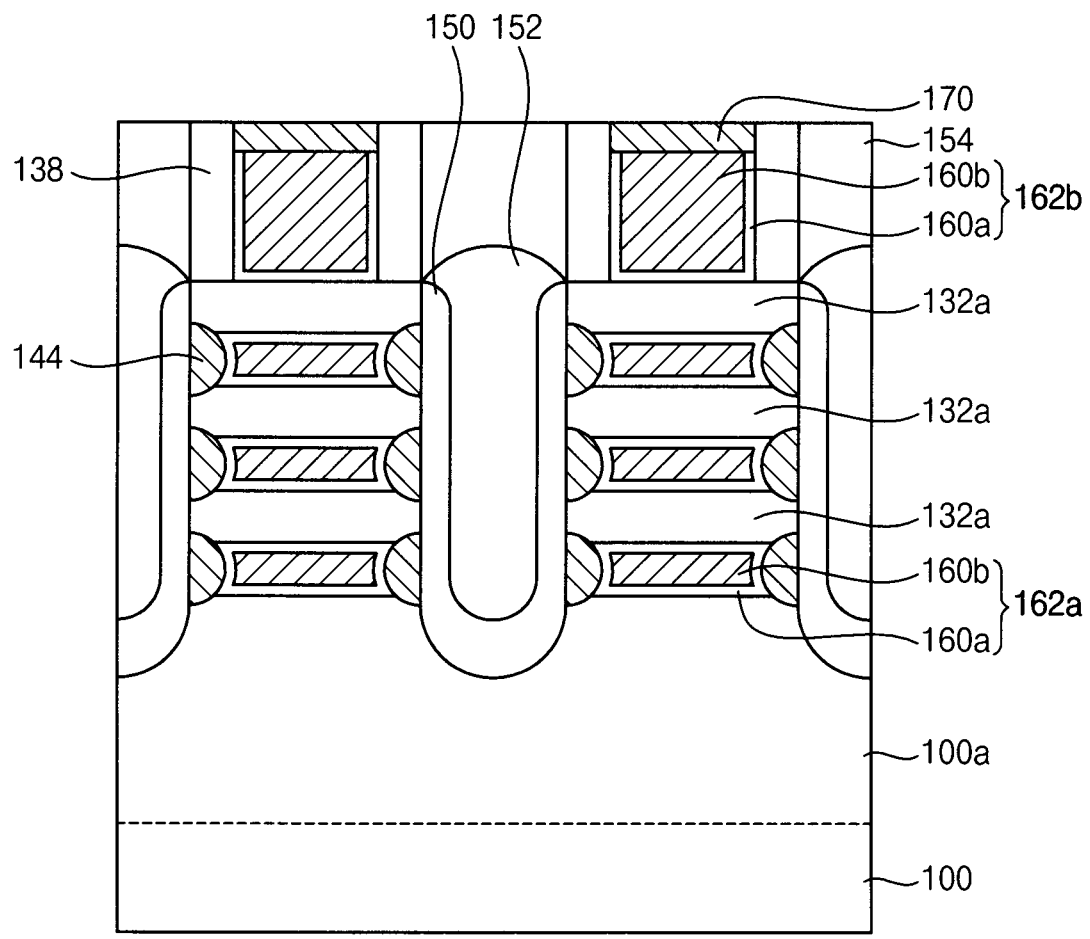
FIGS. 31 and 32 are cross-sectional views illustrating a method of manufacturing a semiconductor device in accordance with example embodiments.
Figure 32:
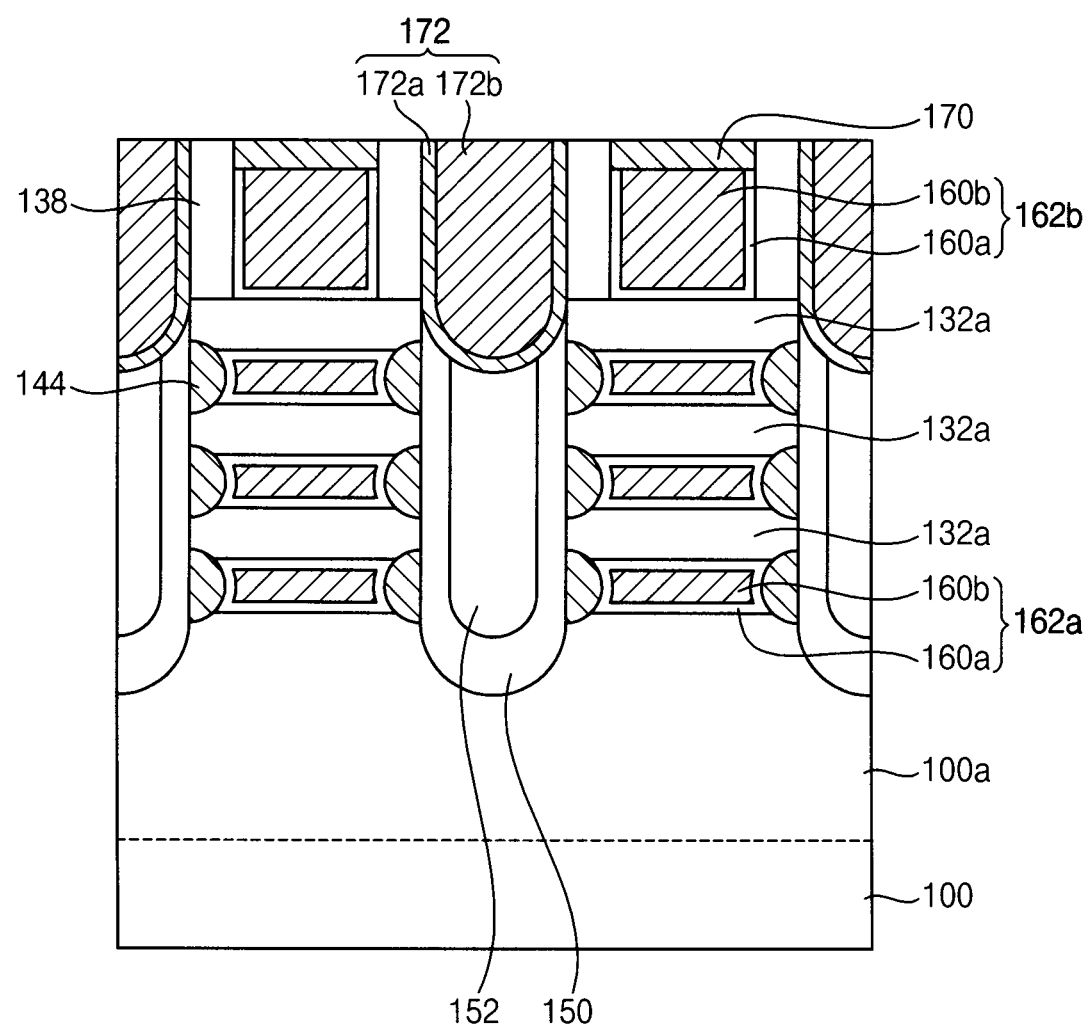

FIGS. 31 and 32 are cross-sectional views illustrating a method of manufacturing a semiconductor device in accordance with example embodiments.

The semiconductor device shown in FIG. 30 may be manufactured by performing the processes illustrated with reference to FIGS. 5 to 27, and further performing additional processes.

Referring to FIG. 31, first, processes the same as or similar to those illustrated with reference to FIGS. 5 to 27 may be performed. Thereafter, an upper portion of the second gate structure 162*b* is partially etched to form a recess defined as an upper surface of the second gate structure 162*b* and the second spacer 128.

A capping layer may be formed to fill the recesses. The capping layer may be planarized until an upper surface of the insulation layer is exposed to form a capping pattern. The capping pattern 170 may be formed on the second gate structure 162*b*.

Referring to FIG. 32, the insulation layer 154 between the second gate structures 162*b* may be etched to form a contact hole. Upper surfaces of the first and second semiconductor layers 150 and 152 may be exposed by a bottom surface of the contact hole. In example embodiments, upper portions of the first and second semiconductor layers 150 and 152 may be partially etched in the etching process.

A conductive layer may be formed to fill the contact hole. The conductive layer may be planarized until upper surfaces of the insulation layer 154 and the capping pattern 170 are exposed to form contact plugs 172. The contact plugs 172 may contact upper surfaces of the first and second semiconductor layers 150 and 152 through the insulation layer 154.

Referring to FIG. 30 again, an upper insulating interlayer 174 may be formed on the capping pattern 170, the second spacers 138, and the contact plugs 172. Thereafter, a conductive pattern 176 may be formed on the contact plug 172.

The conductive pattern 176 may pass through the upper insulating interlayer 174, and may contact the contact plug 172. Therefore, the semiconductor device shown in FIG. 30 may be manufactured. In accordance with the example embodiments, a shape of the first spacer may be variously modified.

Hereinafter, example embodiments according to the shape of the first spacer are described.

Figure 33:
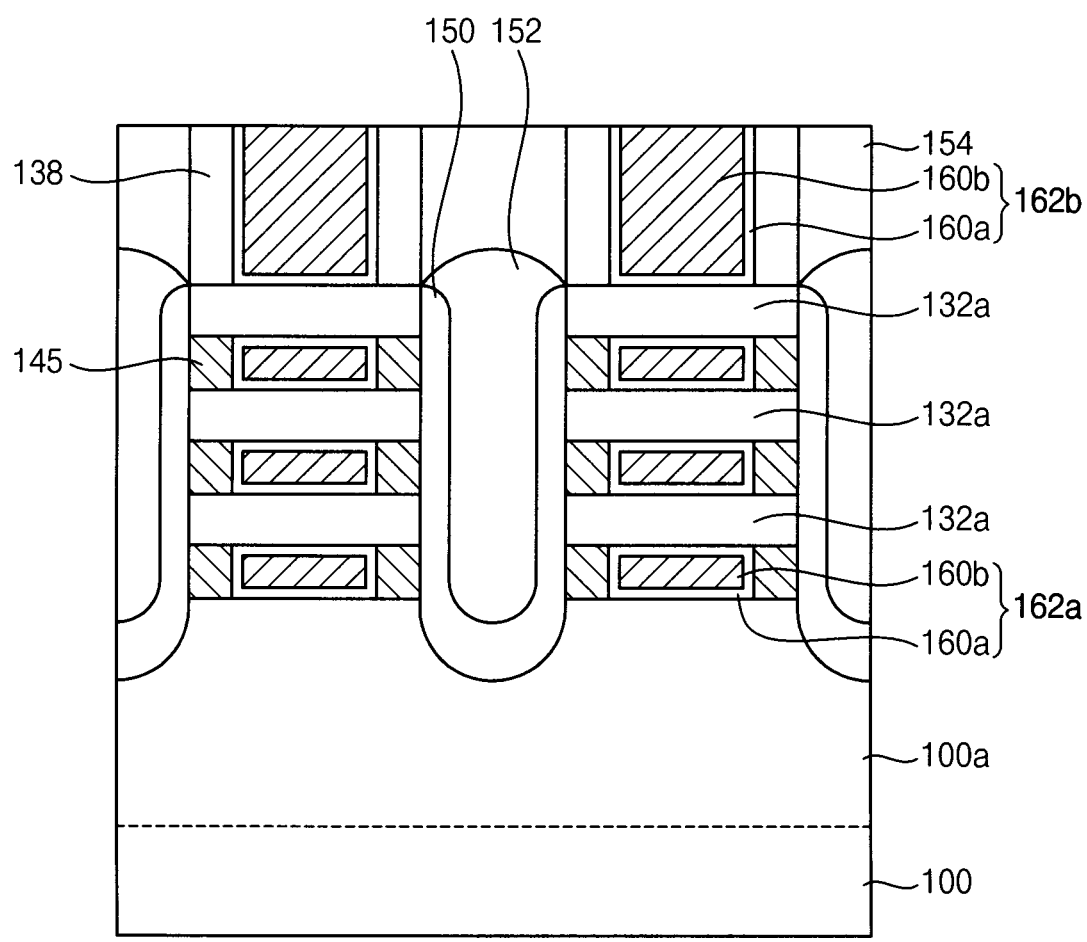
FIG. 33 is a cross-sectional view illustrating a semiconductor device in accordance with example embodiments.

FIG. 33 is a cross-sectional view illustrating a semiconductor device in accordance with example embodiments.

The semiconductor device may be the same as or similar to the semiconductor device illustrated with reference to FIGS. 1A, 1B and 2, except that the first spacer has a cube shape.

Referring to FIG. 33, an outer wall and an inner wall of the first spacer 145 may have a vertical inclination, respectively. The first spacers 145 may contact the sidewalls of the first gate structure 162a and the upper and lower surfaces at edges of the semiconductor pattern 132a. Therefore, according to the shape of the first spacer 145, a thickness of the semiconductor pattern 132a in the vertical direction may be substantially the same regardless of the location of the semiconductor pattern 132. Also, a width of the first gate structure 162a may be substantially the same regardless of the location of the first gate structure 162a.

Figure 34:
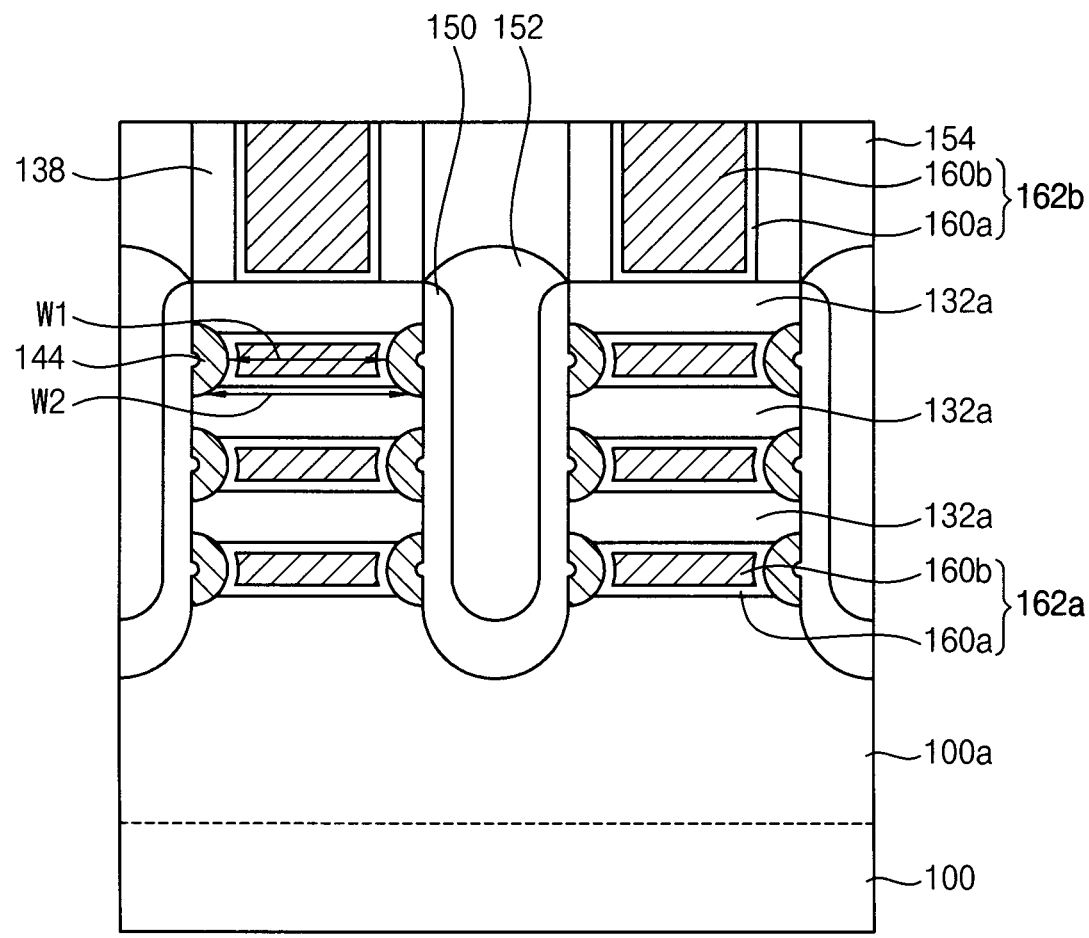
FIGS. 34 to 36 are cross-sectional views illustrating a semiconductor device in accordance with example embodiments, respectively.
Figure 35:
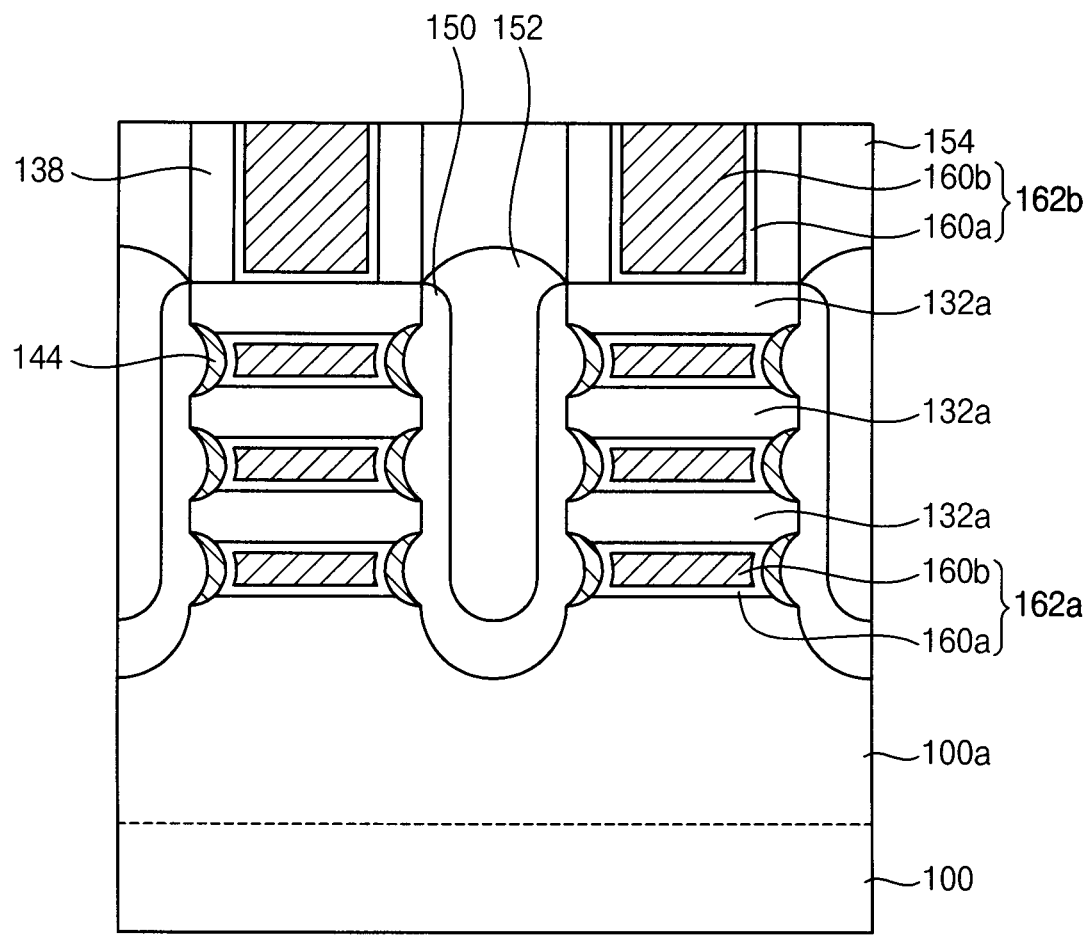
Figure 36:
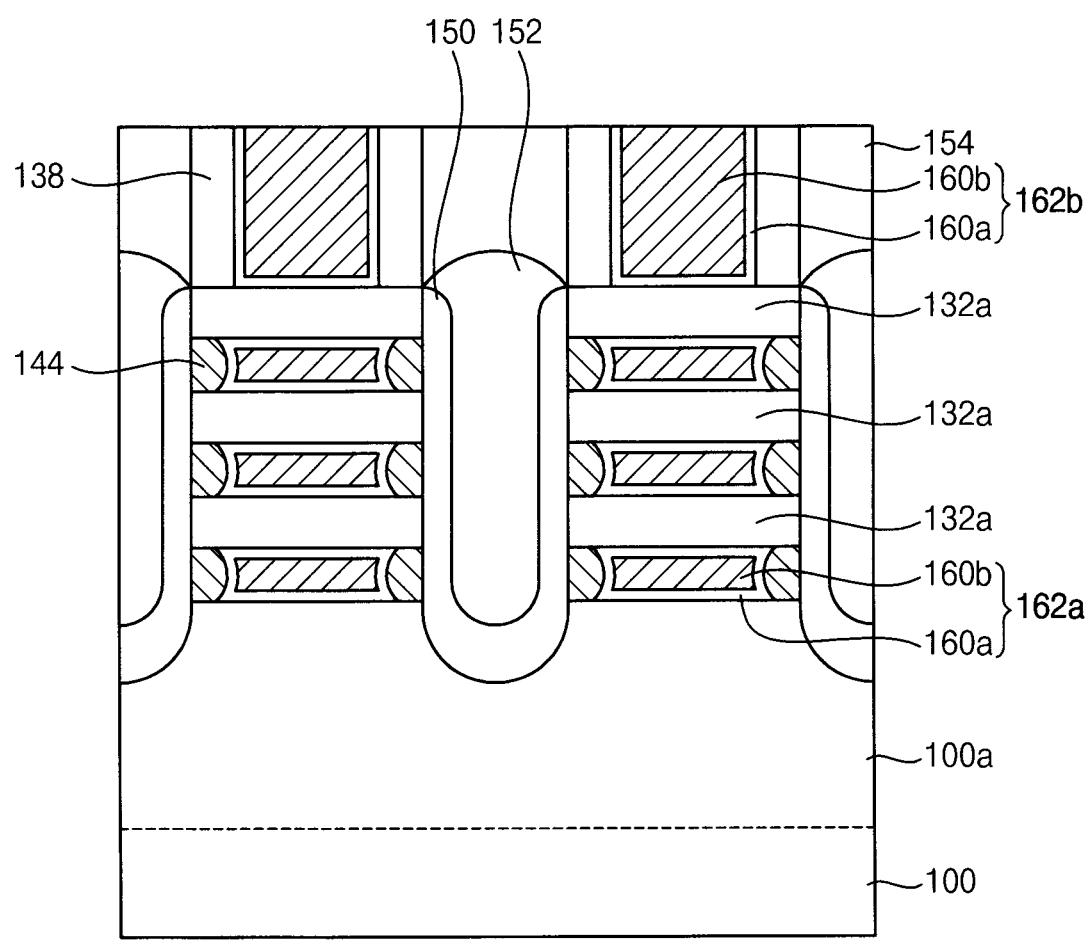

FIGS. 34 to 36 are cross-sectional views illustrating a semiconductor device in accordance with example embodiments, respectively.

Each of the semiconductor devices may be the same as or similar to the semiconductor device illustrated with reference to FIGS. 1A, 1B and 2, except for a shape of the first spacer.

Referring to FIG. 34, an outer wall of the first spacer 144 may include a recess at a central portion in the vertical direction of an outer wall thereof. The recess may have a concave rounded shape toward the central portion of the gate structure in the first direction.

Referring to FIG. 35, an entire outer wall of the first spacer 144 may have a concave rounded shape toward the central portion of the gate structure in the first direction. In example embodiments, a curvature of the outer wall of the first spacer 144 may be less than that of the inner sidewall of the first spacer 144.

In some example embodiments, the first spacers may have different thicknesses in the first direction at each level.

Referring to FIG. 36, an upper surface and a lower surface of the first spacer 144 may be flat. In addition, the inner wall of the first spacer 144 may have a rounded shape.

Figure 37:
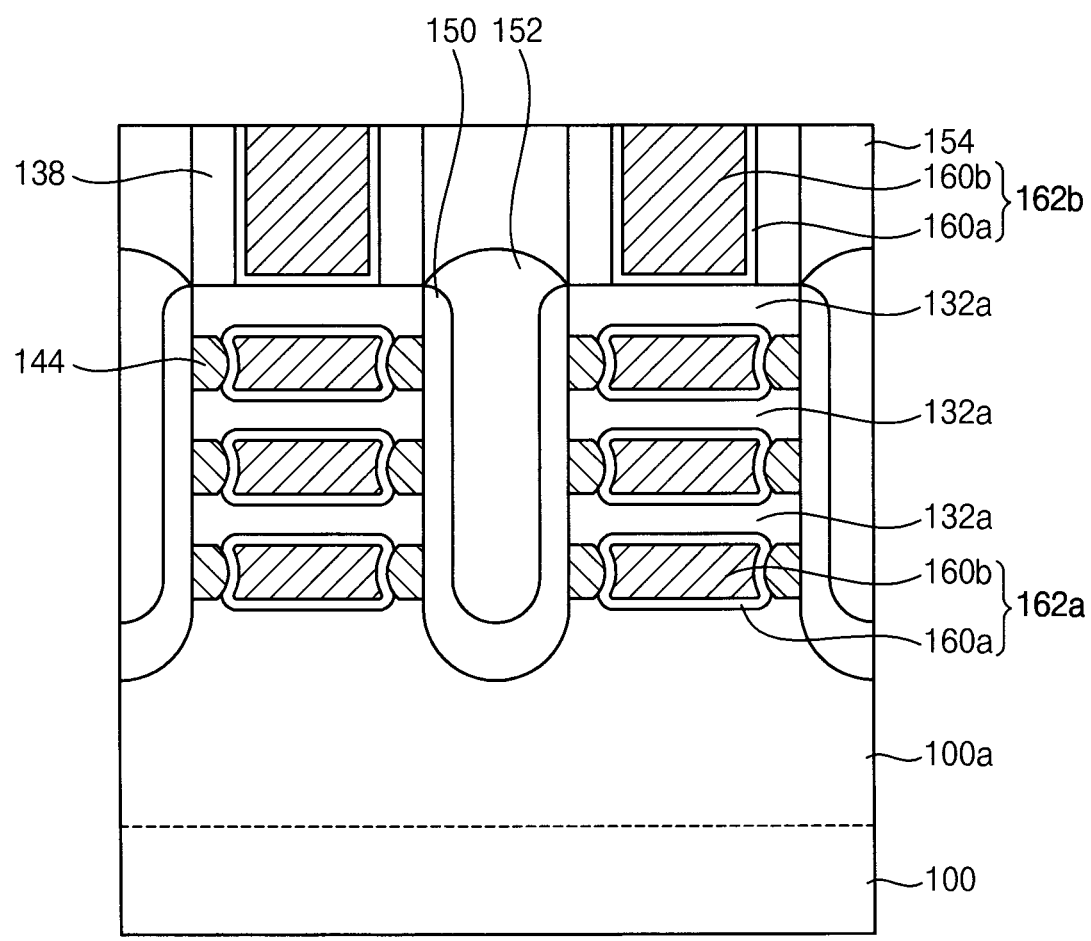
FIG. 37 is a cross-sectional view illustrating a semiconductor device in accordance with example embodiments.

FIG. 37 is a cross-sectional view illustrating a semiconductor device in accordance with example embodiments.

The semiconductor device shown in FIG. 37 may be the same as or similar to the semiconductor device illustrated with reference to FIGS. 1A, 1B and 2 except for the shapes of the gate structure and the spacer.

Referring to FIG. 37, a thickness in the vertical direction of a central portion of the first gate structure 162a may be greater than a thickness in the vertical direction of a central portion of the semiconductor pattern 132a.

When the process illustrated with reference to FIGS. 25 and 26 is performed, the surface of the semiconductor pattern exposed by a top and a bottom of the first gap may be partially etched. Thus, a width in the vertical direction of the first gap may be expanded.

In example embodiments, a thickness in the vertical direction of the central portion of the first gate structure 162a may be greater than a thickness in the vertical direction of the first gate structure 162a at which the first gate structure 162a contacts the first spacer 144.

In example embodiments, a thickness in the vertical direction of the first gate structure 162a may be greater than a thickness in the vertical direction of the first spacer 144.

Figure 38:
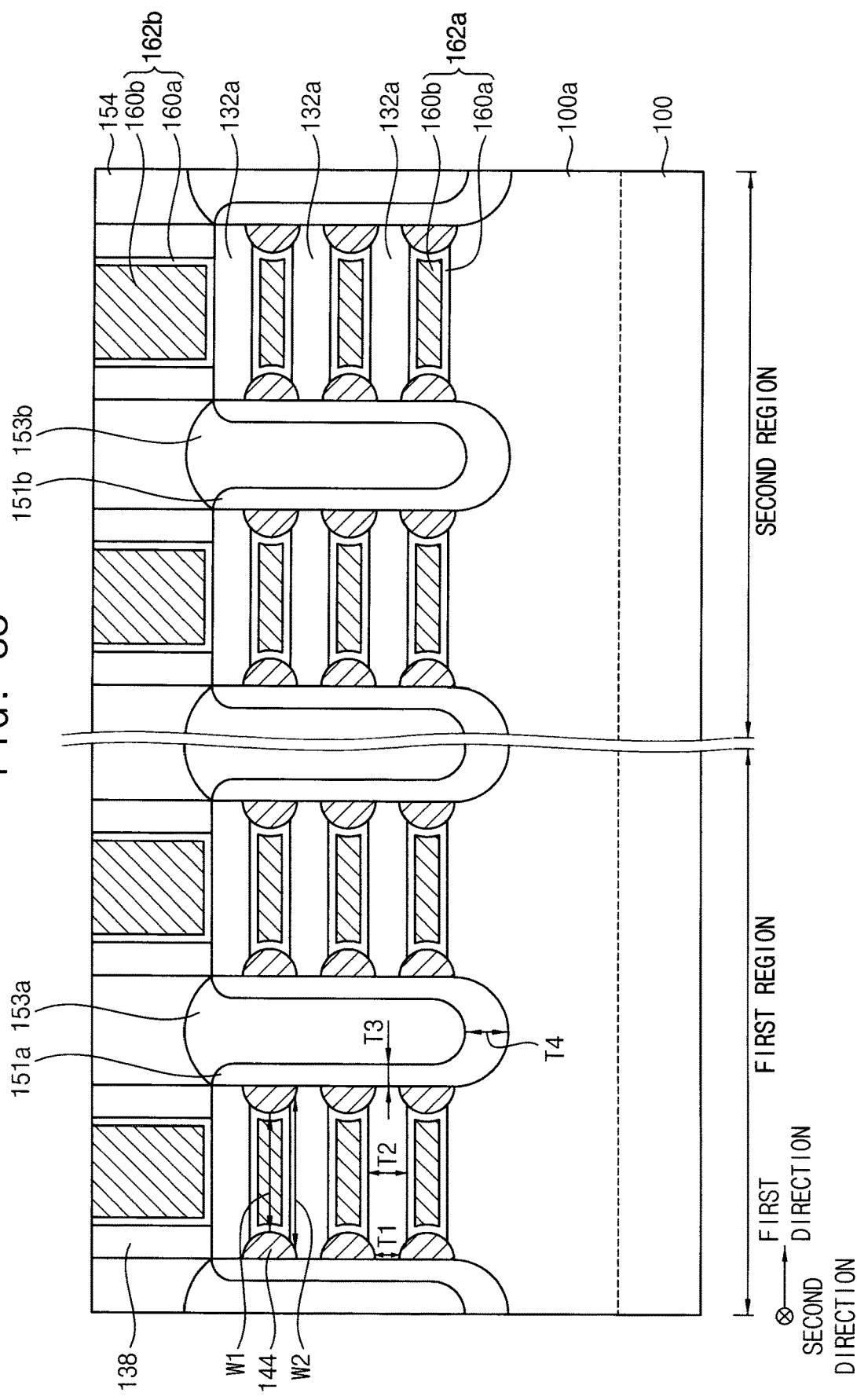
FIG. 38 is a cross-sectional view illustrating a semiconductor in accordance with example embodiments.

FIG. 38 is a cross-sectional view illustrating a semiconductor device in accordance with example embodiments.

The semiconductor device may include an N-type MBCFET formed on a first region of a substrate and a P-type MBCFET formed on a second region of the substrate. The semiconductor device may be a semiconductor chip formed on a die and including an integrated circuit thereon. The integrated circuit includes the N-type MBCFET and the P-type MBCFET.

Referring to FIG. 38, each of the N-type MBCFET and the P-type MBCFET may be the same as the semiconductor device illustrated with reference to FIGS. 1A and 1B and FIG. 2.

For example, in the N-type MBCFET, the first semiconductor layer 151a may include or may be silicon doped with n-type impurities. Also, the second semiconductor layer 153a may include or may be silicon doped with n-type impurities having a concentration higher than that of the first semiconductor layer 151a. For example, the n-type impurities may be or may include phosphorus (P) or arsenic (As).

In the P-type MBCFET, the first semiconductor layer 151b may include or may be silicon germanium doped with p-type impurities. Also, the second semiconductor layer 153b may include or may be silicon germanium doped with p-type impurities having a concentration higher than that of the first semiconductor layer 151b. For example, the p-type impurities may be or may include boron.

As described above, the N-type MBCFET and the P-type MBCFET may include semiconductor layers containing different semiconductor materials.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A semiconductor device, comprising:
    semiconductor patterns on a substrate, the semiconductor patterns spaced apart from each other in a vertical direction perpendicular to an upper surface of the substrate, and overlapping in the vertical direction;

a gate structure on the substrate and the semiconductor patterns, at least portion of the gate structure formed vertically between the semiconductor patterns;

a first spacer covering opposite sidewalls of the gate structure, the sidewalls opposite to each other in a first direction;

a first semiconductor layer covering sidewalls of each of the semiconductor patterns in the first direction, and surfaces of the first spacer and the substrate, the first semiconductor layer having a first concentration of impurities; and a second semiconductor layer directly on the first semiconductor layer, the second semiconductor layer having a second concentration of impurities different from the first concentration of impurities, wherein at least a portion of the first spacer contacts upper and lower surfaces of the semiconductor patterns at edges of each semiconductor pattern, and wherein for each semiconductor pattern, a first thickness in the vertical direction of an edge portion of the semiconductor pattern that contacts the first spacer is less than a second thickness in the vertical direction of a portion of the semiconductor pattern not in contact with the first spacer.

2. The semiconductor device of claim 1, wherein the first spacer contacting the gate structure and the semiconductor pattern has a concave rounded shape toward a central portion of the gate structure in the first direction.

3. The semiconductor device of claim 1, wherein a maximum width in the first direction of the gate structure is less than a maximum width in the first direction of each semiconductor pattern.

4. The semiconductor device of claim 1, wherein the first semiconductor layer is doped with impurities having the first concentration of impurities, and the second semiconductor layer is doped with impurities having the second concentration of impurities higher than the first concentration of impurities.

5. The semiconductor device of claim 1, wherein the first semiconductor layer formed on the first spacer and on sidewalls of the semiconductor patterns in the first direction has a first thickness, and the first semiconductor layer formed on a surface of the substrate has a second thickness greater than the first thickness.

6. The semiconductor device of claim 1, wherein the semiconductor patterns being spaced apart from each other in the vertical direction serve as a semiconductor pattern structure, and a plurality of semiconductor pattern structures are spaced apart from each other in each of the first direction and a second direction perpendicular to the first direction and parallel to the upper surface of the substrate.

7. The semiconductor device of claim 6, wherein the first semiconductor layer has a continuously connected shape to cover the sidewalls of the semiconductor patterns and the first spacer in the semiconductor pattern structures and the substrate, and wherein the second semiconductor layer fills a space between the semiconductor pattern structures adjacent to each other in the first direction.

8. The semiconductor device of claim 6, wherein the gate structure contacts side surfaces of semiconductor patterns included in the semiconductor pattern structure in the second direction, and the gate structure extends in the second direction.

9. The semiconductor device of claim 1, wherein an outer wall of the first spacer is disposed to be aligned in the vertical direction with the sidewalls of the semiconductor patterns.

10. The semiconductor device of claim 1, wherein an outer wall of the first spacer is inwardly recessed from the sidewalls of the semiconductor patterns in the first direction.

11. The semiconductor device of claim 1, wherein the gate structure is further formed on an uppermost semiconductor pattern, and further comprising a second spacer on sidewalls in the first direction of the gate structure formed on the uppermost semiconductor pattern.

12. The semiconductor device of claim 1, wherein the first spacer includes at least one of silicon nitride, silicon carbonitride, silicon boron nitride, and silicon oxynitride.

13. The semiconductor device of claim 1, wherein a top surface of the second semiconductor layer is higher than a top surface of an uppermost one of the semiconductor patterns, and the second semiconductor layer overlaps the first semiconductor layer in the first direction.

14. A semiconductor device, comprising:
a stacked structure formed on a substrate, the stacked structure including a semiconductor pattern, a gate structure and a first spacer, and the semiconductor pattern and the first spacer being exposed at an outer wall of the stacked structure in a first direction parallel to an upper surface of the substrate;

a first semiconductor layer covering the outer wall of the stacked structure in the first direction and covering a surface of the substrate, the first semiconductor layer doped with impurities having a first concentration; and a second semiconductor layer on the first semiconductor layer, the second semiconductor layer doped with impurities having a second concentration higher than the first concentration, wherein the first spacer contacts upper and lower surfaces of the semiconductor pattern at edges of the semiconductor pattern, and a first thickness of the semiconductor pattern in a vertical direction at the edges of the semiconductor pattern that contacts the first spacer is less than a second thickness in the vertical direction of a portion of the semiconductor pattern not in contact with the first spacer.

15. The semiconductor device of claim 14, wherein a plurality of the stacked structures are arranged to be spaced apart from each other in each of the first direction and a second direction, wherein the first semiconductor layer has a continuously connected shape to cover the outer wall of the stacked structures adjacent to each other in the first direction and the surface of the substrate between the stacked structures, and the second semiconductor layer fills a space between the stacked structures adjacent to each other in the first direction.

16. The semiconductor device of claim 14, wherein the first spacer contacting the gate structure and the semiconductor pattern has a concave rounded shape toward a central portion of the gate structure in the first direction.

17. A semiconductor device, comprising:
semiconductor patterns on a substrate, the semiconductor patterns spaced apart from each other in a vertical direction perpendicular to an upper surface of the substrate;

a first spacer formed between the semiconductor patterns in the vertical direction, the first spacer contacting upper and lower surfaces of the semiconductor patterns at edges of the semiconductor patterns;

a gate structure on the substrate to fill a first gap defined by the semiconductor patterns and first spacer;

a first semiconductor layer covering sidewalls of the semiconductor patterns in a first direction, and surfaces of the first spacer and the substrate; and a second semiconductor layer directly on the first semiconductor layer and overlapping the first semiconductor layer in the first direction, the second semiconductor layer having a concentration of impurities different from a concentration of impurities of the first semiconductor layer.

18. The semiconductor device of claim 17, wherein the first semiconductor layer is doped with impurities of a first concentration, and the second semiconductor layer is doped with impurities of a second concentration higher than the first concentration.

* * * * *